(12) United States Patent
Jung et al.

(10) Patent No.: US 12,295,142 B2
(45) Date of Patent: May 6, 2025

(54) INTEGRATED CIRCUIT DEVICES AND ELECTRONIC SYSTEMS INCLUDING THE SAME

(71) Applicant: Samsung Electronics Co., Ltd., Suwon-si (KR)

(72) Inventors: Youngjin Jung, Goyang-si (KR); Sora Kim, Hwaseong-si (KR); Haeli Park, Hwaseong-si (KR); Kwuiyeon Yu, Suwon-si (KR); Janggn Yun, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 455 days.

(21) Appl. No.: 17/728,317

(22) Filed: Apr. 25, 2022

(65) Prior Publication Data

US 2023/0005953 A1 Jan. 5, 2023

(30) Foreign Application Priority Data

Jun. 30, 2021 (KR) .................. 10-2021-0085766

(51) Int. Cl.
| | |
|---|---|
| *H10B 43/27* | (2023.01) |
| *G11C 16/04* | (2006.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |

(Continued)

(52) U.S. Cl.
CPC ......... *H10B 43/27* (2023.02); *G11C 16/0483* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 41/10; H10B 43/10; H10B 43/27; G11C 16/0483
See application file for complete search history.

(56) References Cited

U.S. PATENT DOCUMENTS

| | | |
|---|---|---|
| 9,449,987 B1 | 9/2016 | Miyata et al. |
| 10,748,924 B2 | 8/2020 | Kim |

(Continued)

FOREIGN PATENT DOCUMENTS

| | | |
|---|---|---|
| KR | 101968856 B1 | 4/2019 |
| KR | 20210028399 A | 3/2021 |

*Primary Examiner* — Jay C Kim
*Assistant Examiner* — Jacob T Nelson
(74) *Attorney, Agent, or Firm* — Myers Bigel, P.A.

(57) ABSTRACT

An integrated circuit device according to the inventive concept includes: a semiconductor substrate including a cell region and a connection region; a gate stack including a plurality of gate electrodes and a plurality of insulating layers extending on a main surface of the semiconductor substrate in a horizontal direction and alternately stacked thereon in a vertical direction, the gate stack having a stair structure in the connection region; and a plurality of contact plugs in the connection region, wherein, in a portion of the connection region, a first length, in the horizontal direction, of a first gate electrode that is located in the lowest layer among the plurality of gate electrodes is less than a second length, in the horizontal direction, of a second gate electrode that is located above the first gate electrode.

20 Claims, 17 Drawing Sheets

(51) Int. Cl.
*H10B 43/35* (2023.01)
*H10B 43/40* (2023.01)

(56) References Cited

U.S. PATENT DOCUMENTS

| | | | |
|---|---|---|---|
| 10,847,534 B2 | 11/2020 | Chu | |
| 2014/0061929 A1* | 3/2014 | Inaba | H01L 21/768 |
| | | | 438/642 |
| 2016/0163686 A1* | 6/2016 | Lee | H10B 41/27 |
| | | | 257/314 |
| 2019/0333932 A1* | 10/2019 | Kim | H10B 43/10 |
| 2020/0006377 A1* | 1/2020 | Chu | H10B 43/27 |
| 2020/0006378 A1 | 1/2020 | Huo | |
| 2020/0388630 A1 | 12/2020 | Yun et al. | |
| 2021/0036013 A1 | 2/2021 | Lee et al. | |

* cited by examiner

INTEGRATED CIRCUIT DEVICES AND ELECTRONIC SYSTEMS INCLUDING THE SAME

CROSS-REFERENCE TO RELATED APPLICATION

This application is based on and claims priority under 35 U.S.C. § 119 to Korean Patent Application No. 10-2021-0085766, filed on Jun. 30, 2021, in the Korean Intellectual Property Office, the disclosure of which is incorporated by reference herein in its entirety

BACKGROUND

The present disclosure relates to integrated circuit devices. The integration density of an integrated circuit device may be increased to satisfy the demand for products with excellent performance and economic feasibility. In particular, the integration density of an integrated circuit device may be a significant factor for determining the economic feasibility of a product. Because the integration density of a two-dimensional memory device is mainly determined by an area occupied by a unit memory cell, the integration density of a two-dimensional memory device may be significantly influenced by a level of a fine pattern forming technique. However, expensive equipment may be used to form a fine pattern, and an area of a chip die may be limited, and thus, the increase in the integration density of a two-dimensional memory device may still be limited. Accordingly, a vertical memory device having a three-dimensional structure may be demanded.

SUMMARY

The inventive concept provides an integrated circuit device having a vertical memory device, wherein the occurrence of a leakage current through a dummy contact plug is inhibited/prevented in advance by forming a ground select line to have a relatively short horizontal length in a connection region in which the dummy contact plug is arranged.

The inventive concept is not limited to the problem described above, and other problems which are not mentioned may be clearly understood by those of ordinary skill in the art from the disclosure below.

According to some embodiments of the inventive concept, there is provided an integrated circuit device including: a semiconductor substrate including a cell region and a connection region adjacent to the cell region; a gate stack including a plurality of gate electrodes and a plurality of insulating layers extending on a main surface of the semiconductor substrate in a horizontal direction and alternately stacked thereon in a vertical direction, the gate stack having a stair structure in the connection region; a channel structure in the cell region and extending through the plurality of gate electrodes in the vertical direction; and a plurality of contact plugs in the connection region, wherein, in a portion of the connection region, a first length, in the horizontal direction, of a first gate electrode that is located in the lowest layer among the plurality of gate electrodes is less than a second length, in the horizontal direction, of a second gate electrode that is located above the first gate electrode.

According to some embodiments of the inventive concept, there is provided an integrated circuit device including: a semiconductor substrate including a cell region and a connection region adjacent to the cell region and including a first part and a second part neighboring to each other; a first gate stack including a plurality of gate electrodes and a plurality of insulating layers extending on a main surface of the semiconductor substrate in a horizontal direction and alternately stacked thereon in a vertical direction, the first gate stack having a stair structure in the connection region; a channel structure in the cell region and extending through the plurality of gate electrodes in the vertical direction; and a plurality of contact plugs in the connection region. Moreover, the integrated circuit device may include a second gate stack. In the first part of the connection region, a first length, in the horizontal direction, of a first gate electrode of the first gate stack that is located in the lowest layer among the plurality of gate electrodes is less than a second length, in the horizontal direction, of a second gate electrode of the first gate stack that is located above the first gate electrode and a first contact plug of the plurality of contact plugs that is adjacent to the first gate electrode is in direct contact with the semiconductor substrate without being in direct contact with the first gate electrode; and in the second part of the connection region, the first length of a lowermost, first gate electrode of the second gate stack is greater than the second length of a second gate electrode of the second gate stack that is located above the first gate electrode of the second gate stack, and a second contact plug of the plurality of contact plugs is in direct contact with the first gate electrode of the second gate stack.

According to some embodiments of the inventive concept, there is provided an electronic system including: a main substrate; an integrated circuit device on the main substrate; and a controller on the main substrate and electrically connected to the integrated circuit device, wherein the integrated circuit device includes: a semiconductor substrate including a cell region and a connection region adjacent to the cell region; a gate stack including a plurality of gate electrodes and a plurality of insulating layers extending on a main surface of the semiconductor substrate in a horizontal direction and alternately stacked thereon in a vertical direction, the gate stack having a stair structure in the connection region; a channel structure in the cell region and extending through the plurality of gate electrodes in the vertical direction; and a plurality of contact plugs in the connection region, wherein, in a portion of the connection region, a first length, in the horizontal direction, of a first gate electrode that is located in the lowest layer among the plurality of gate electrodes is less than a second length, in the horizontal direction, of a second gate electrode that is located above the first gate electrode.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept are described in detail with reference to the accompanying drawings.

Figure 1:
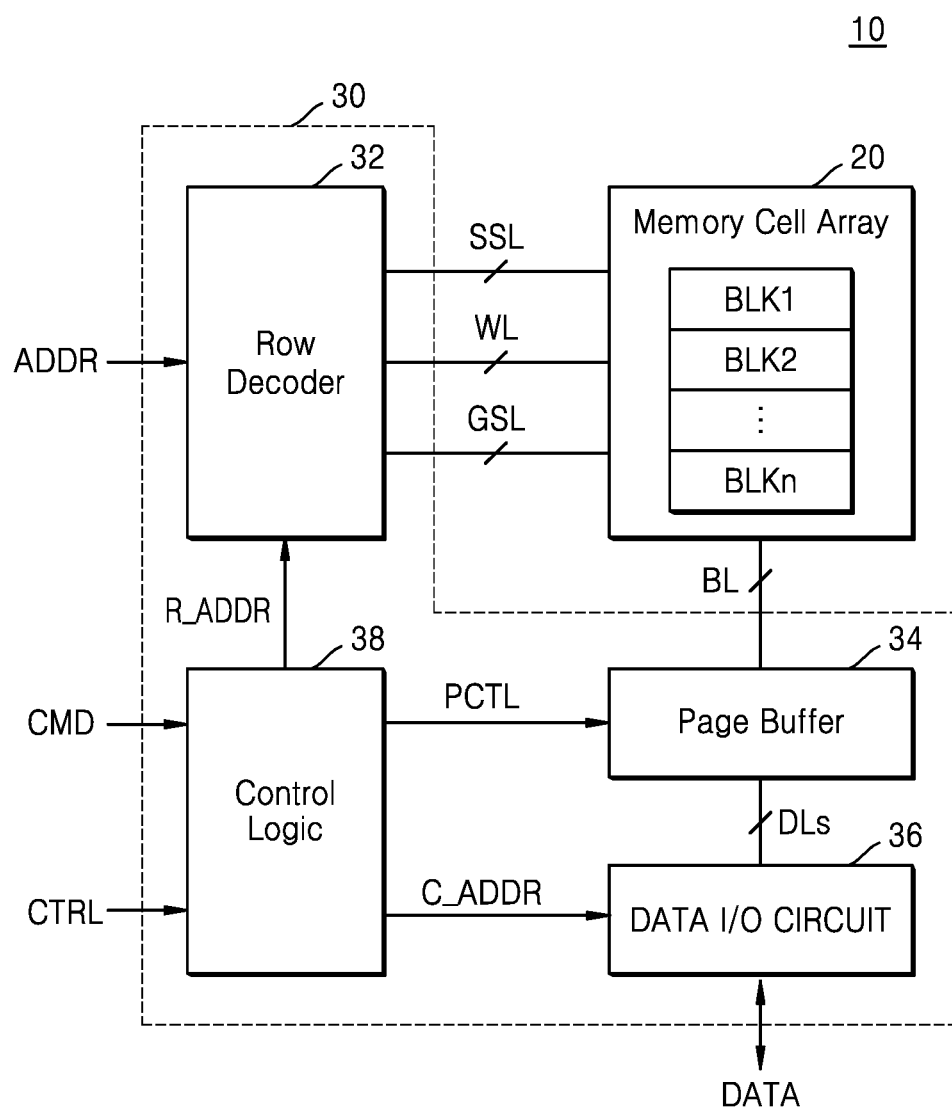
FIG. 1 is a block diagram of an integrated circuit device according to an embodiment of the inventive concept.

FIG. 1 is a block diagram of an integrated circuit device 10 according to an embodiment of the inventive concept.

Referring to FIG. 1, the integrated circuit device 10 may include a memory cell array 20 and a peripheral circuit 30.

The memory cell array 20 includes a plurality of memory cell blocks BLK1, BLK2, . . . , and BLKn. Each of the plurality of memory cell blocks BLK1, BLK2, . . . , and BLKn may include a plurality of memory cells. The plurality of memory cell blocks BLK1, BLK2, . . . , and BLKn may be connected to the peripheral circuit 30 through bit lines BL, word lines WL, string select lines SSL, and ground select lines GSL.

The memory cell array 20 may be connected to a page buffer 34 through the bit lines BL and connected to a row decoder 32 through the word lines WL, the string select lines SSL, and the ground select lines GSL. In the memory cell array 20, each of a plurality of memory cells included in the plurality of memory cell blocks BLK1, BLK2, . . . , and BLKn may be a flash memory cell. The memory cell array 20 may include a three-dimensional memory cell array. The three-dimensional memory cell array may include a plurality of NAND strings, and each of the plurality of NAND strings may include a plurality of memory cells connected to a plurality of word lines WL which are vertically stacked.

The peripheral circuit 30 may include the row decoder 32, the page buffer 34, a data input-output (I/O) circuit 36, and a control logic 38. Although not shown, the peripheral circuit 30 may further include various circuits such as a voltage generation circuit configured to generate various voltages needed for an operation of the integrated circuit device 10, an error correction circuit configured to correct an error of data read from the memory cell array 20, and an input-output interface.

The peripheral circuit 30 may receive an address ADDR, a command CMD, and a control signal CTRL from the outside of the integrated circuit device 10 and transmit and receive data DATA to and from a device outside the integrated circuit device 10.

A configuration of the peripheral circuit 30 is particularly described as follows.

The row decoder 32 may select at least one of the plurality of memory cell blocks BLK1, BLK2, . . . , and BLKn in response to the address ADDR from the outside (e.g., from outside of the peripheral circuit 30) and select a word line WL, a string select line SSL, and a ground select line GSL of the selected memory cell block. The row decoder 32 may deliver, to the word line WL of the selected memory cell block, a voltage for performing a memory operation.

The page buffer 34 may be connected to the memory cell array 20 through the bit lines BL. The page buffer 34 may operate as a write driver during a program operation to apply, to the bit lines BL, a voltage according to the data DATA to be stored in the memory cell array 20, and operate as a sensing amplifier during a read operation to sense the data DATA stored in the memory cell array 20. The page buffer 34 may operate in response to a control signal PCTL provided from the control logic 38.

The data input-output circuit 36 may be connected to the page buffer 34 through data lines DLs. During a program operation, the data input-output circuit 36 may receive the data DATA from a memory controller (not shown) and provide the data DATA to the page buffer 34 as program data based on a column address C_ADDR provided from the control logic 38. During a read operation, the data input-output circuit 36 may provide the data DATA stored in the page buffer 34 to the memory controller as read data based on the column address C_ADDR provided from the control logic 38. The data input-output circuit 36 may deliver an input address or instruction to the control logic 38 or the row decoder 32.

The control logic 38 may receive the command CMD and the control signal CTRL from the memory controller. The control logic 38 may provide a row address R_ADDR to the row decoder 32 and provide the column address C_ADDR to the data input-output circuit 36. The control logic 38 may generate various kinds of internal control signals to be used inside the integrated circuit device 10, in response to the control signal CTRL. For example, the control logic 38 may adjust voltage levels to be provided to the word lines WL and the bit lines BL during a memory operation such as a program operation or an erase operation.

Figure 2:
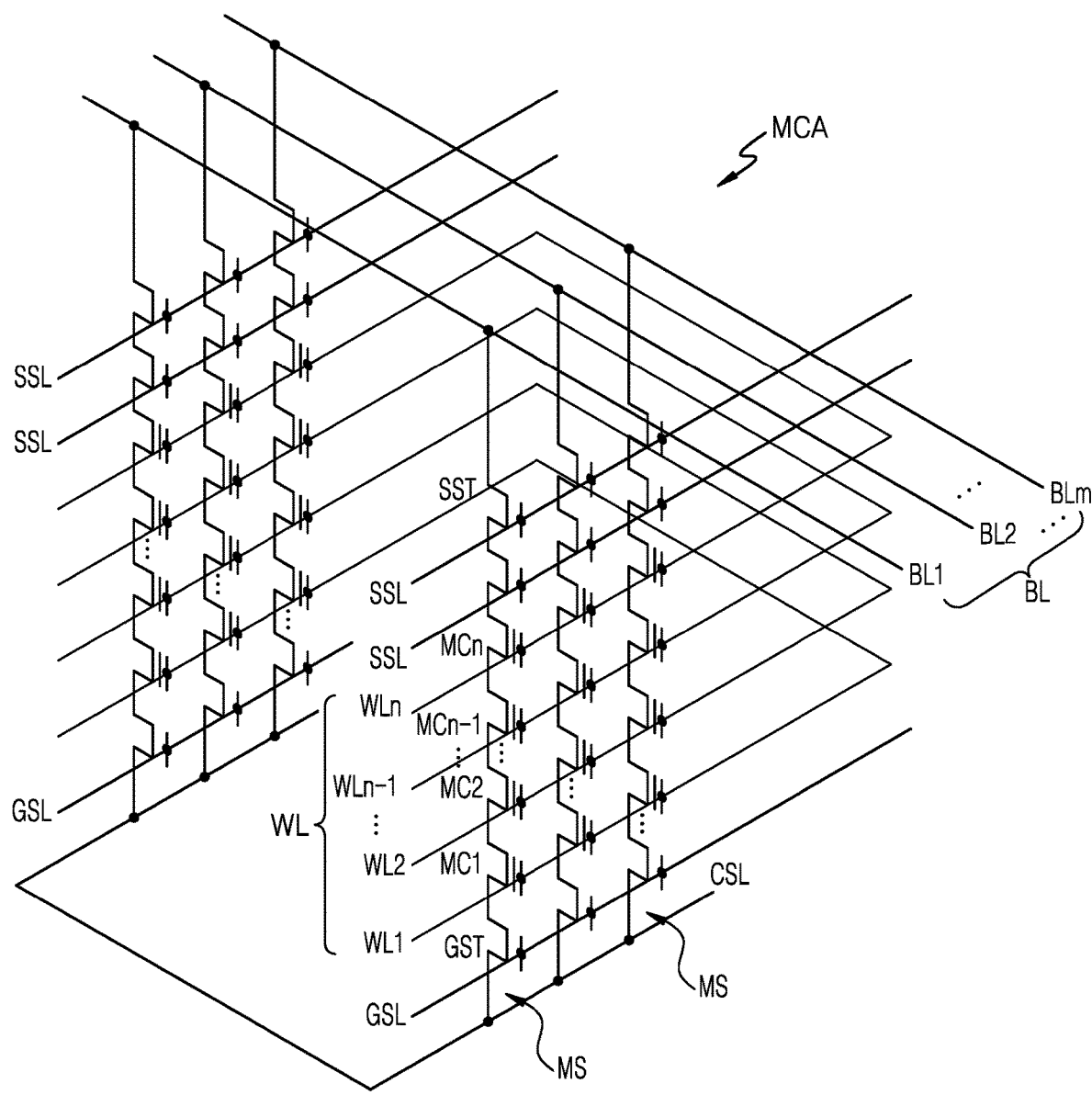
FIG. 2 is an equivalent circuit diagram of a memory cell array in an integrated circuit device, according to an embodiment of the inventive concept.

FIG. 2 is an equivalent circuit diagram of a memory cell array MCA in an integrated circuit device, according to an embodiment of the inventive concept.

Referring to FIG. 2, an equivalent circuit diagram of a vertical NAND flash memory device having a vertical channel structure is shown as an example.

The memory cell array MCA may include a plurality of memory cell strings MS. The memory cell array MCA may include a plurality of bit lines BL (e.g., bit lines BL1-BLm), a plurality of word lines WL (e.g., word lines WL1-WLn), at least one string select line SSL, at least one ground select line GSL, and a common source line CSL.

The plurality of memory cell strings MS may be formed between the plurality of bit lines BL and the common source line CSL. Although FIG. 2 shows that each of the plurality of memory cell strings MS includes two string select lines SSL, the inventive concept is not limited thereto. For example, each of the plurality of memory cell strings MS may include one string select line SSL.

Each of the plurality of memory cell strings MS may include a string select transistor SST, a ground select transistor GST, and a plurality of memory cell transistors MC1, MC2, . . . , MCn−1, and MCn. A drain region of the string select transistor SST may be connected to a bit line BL, and a source region of the ground select transistor GST may be connected to the common source line CSL. The common source line CSL may be a region to which source regions of a plurality of ground select transistors GST are commonly connected.

The string select transistor SST may be connected to a string select line SSL, and the ground select transistor GST may be connected to a ground select line GSL. The plurality of memory cell transistors MC1, MC2, ..., MCn−1, and MCn may be connected to the plurality of word lines WL, respectively.

Figure 3:
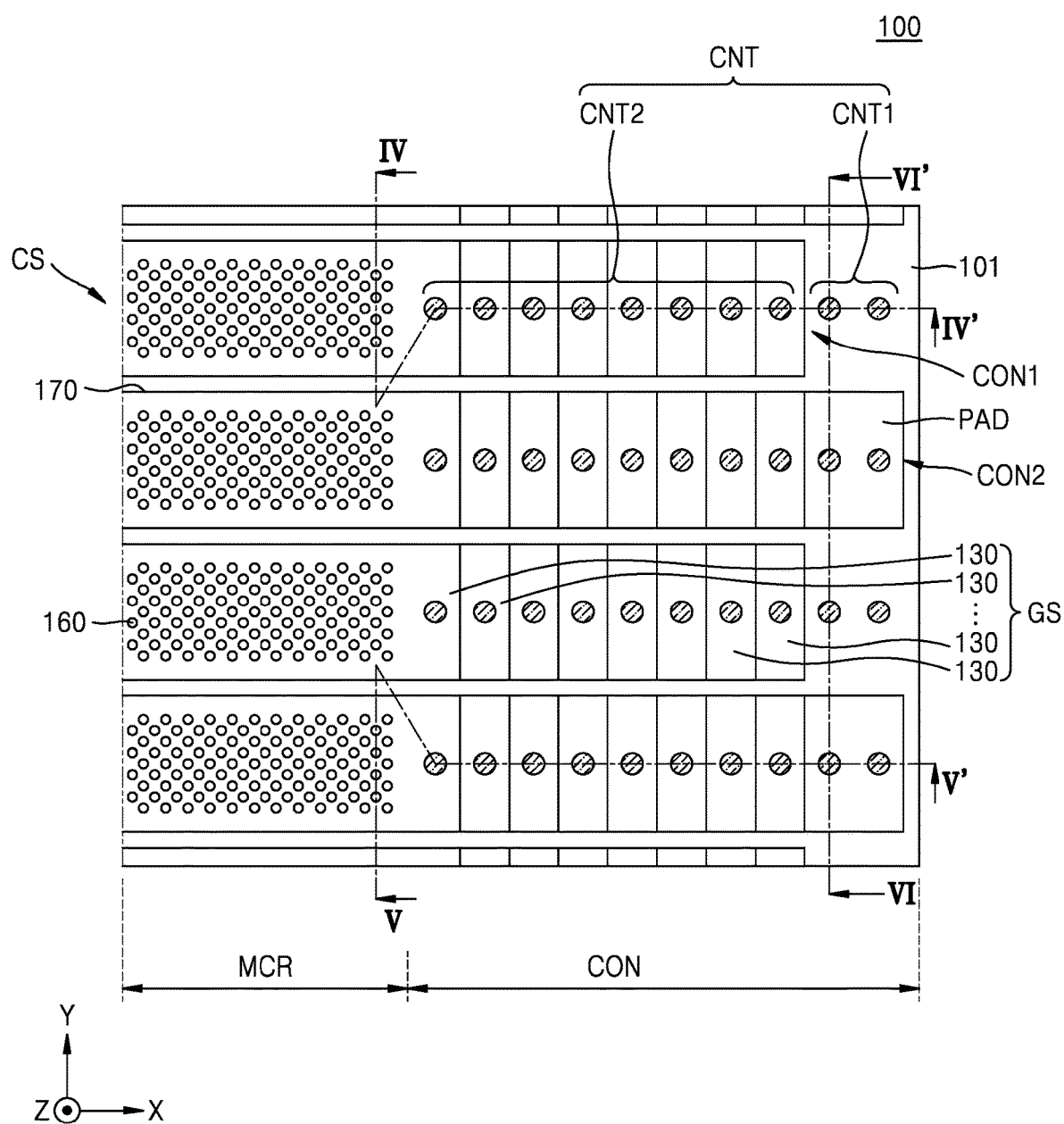
FIG. 3 is a top view of components in an integrated circuit device, according to an embodiment of the inventive concept.
Figure 4:
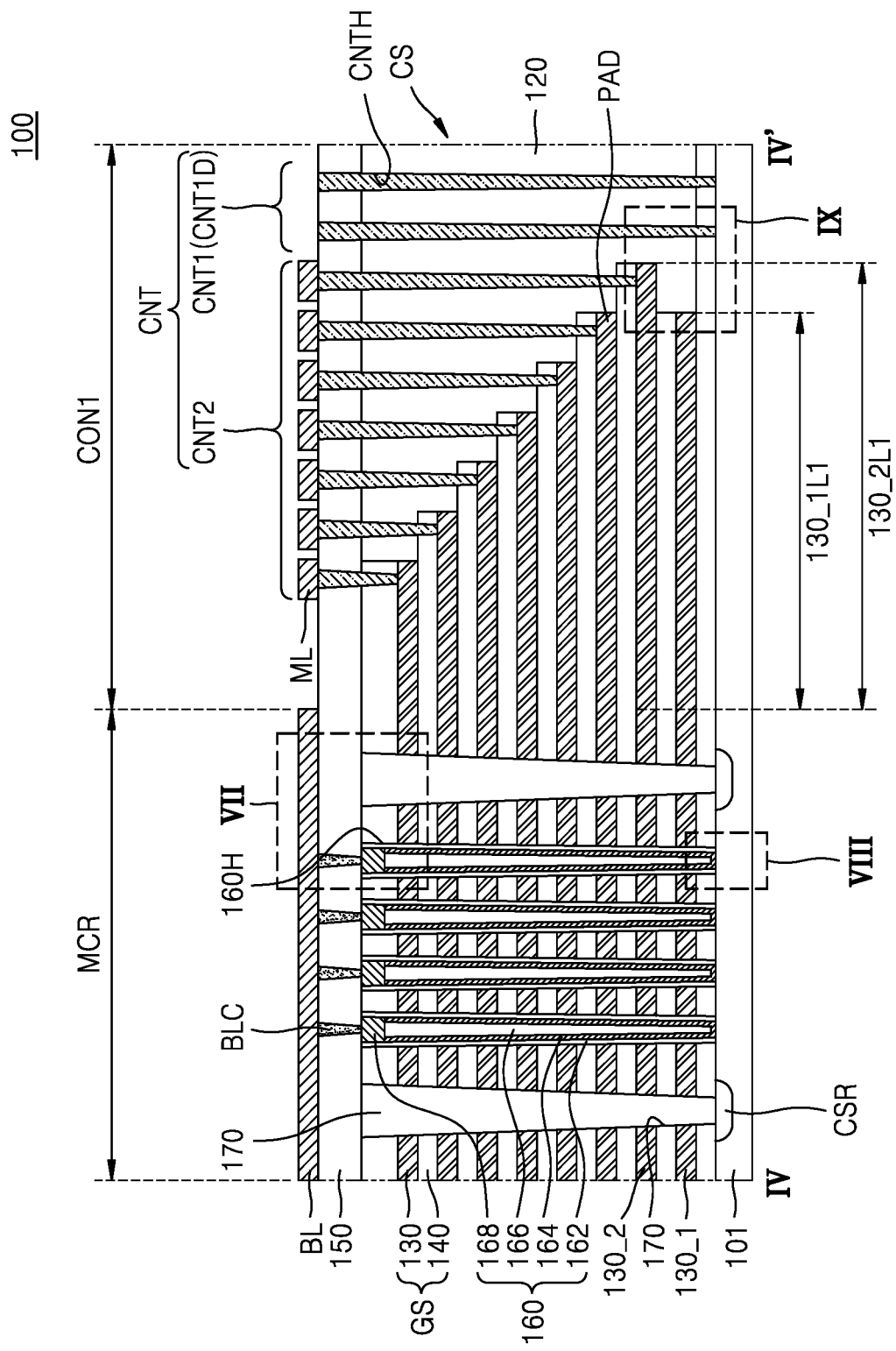
FIG. 4 is a cross-sectional view taken along line IV-IV' of FIG. 3.
Figure 5:
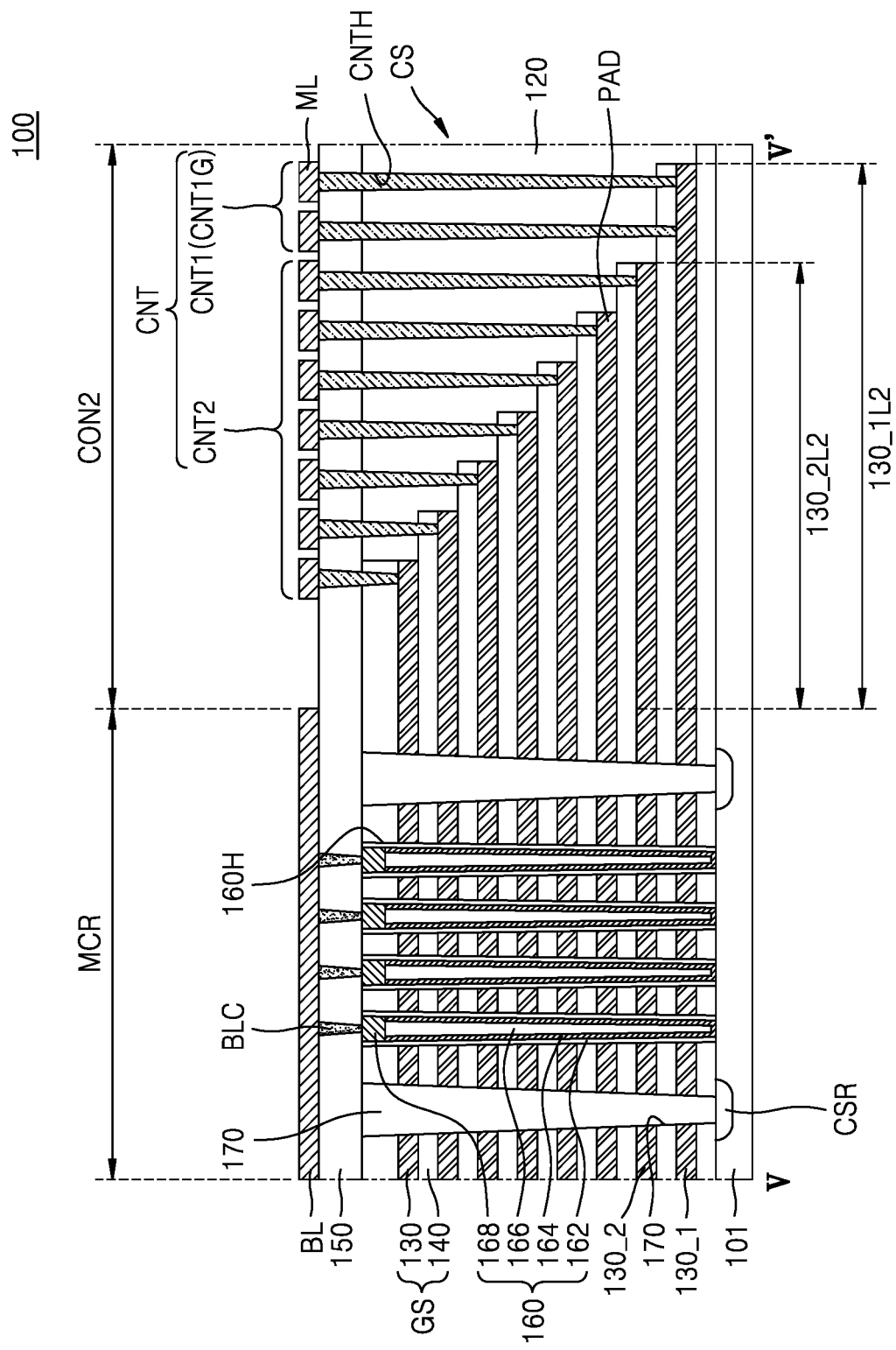
FIG. 5 is a cross-sectional view taken along line V-V of FIG. 3.
Figure 6:
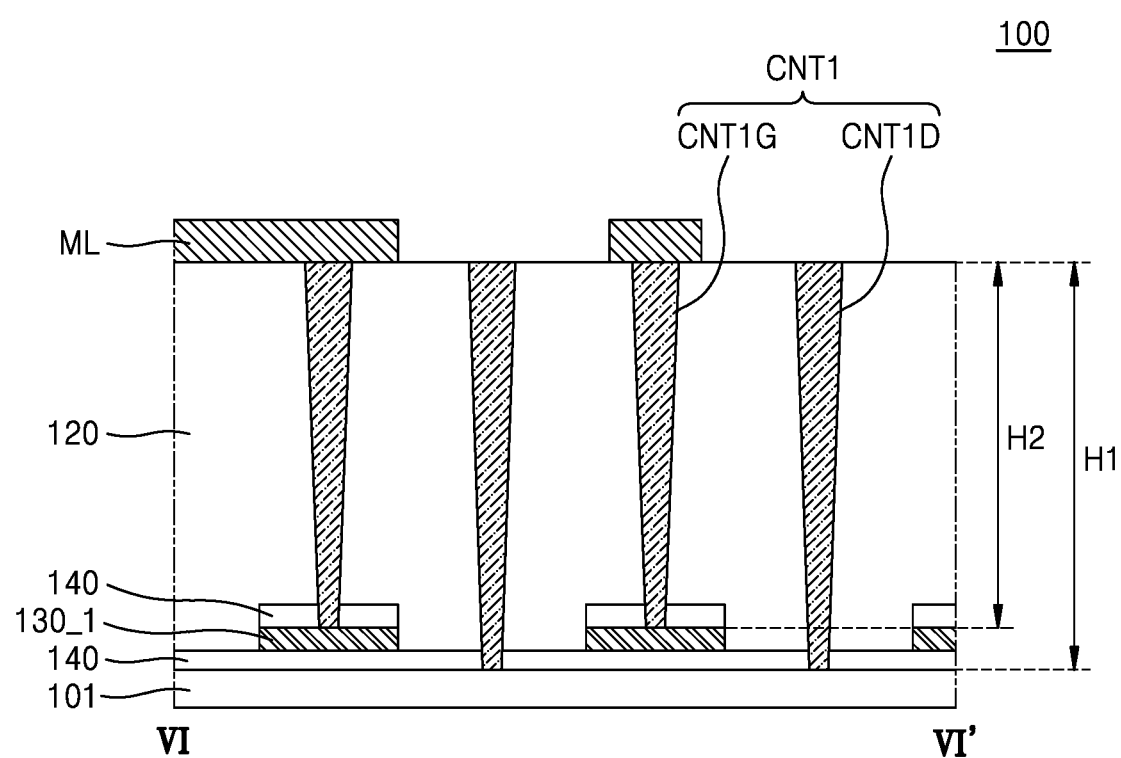
FIG. 6 is a cross-sectional view taken along line VI-VI' of FIG. 3.
Figure 7:
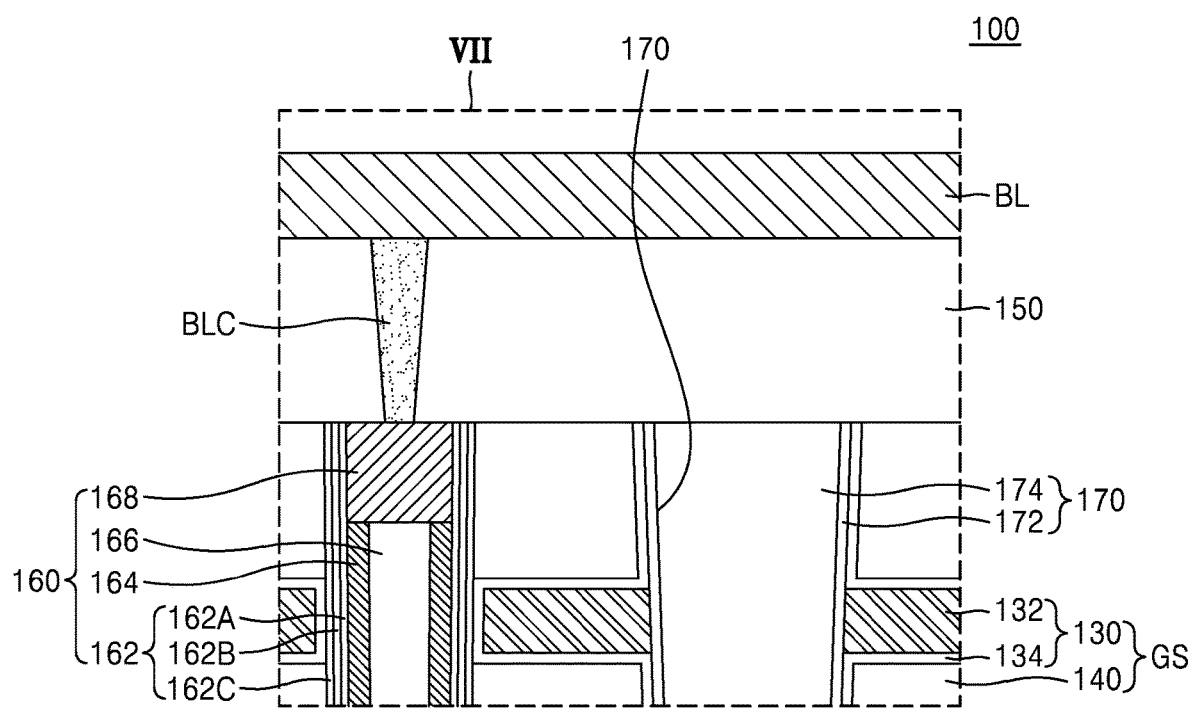
FIG. 7 is a magnified view of a portion VII of FIG. 4.
Figure 8:
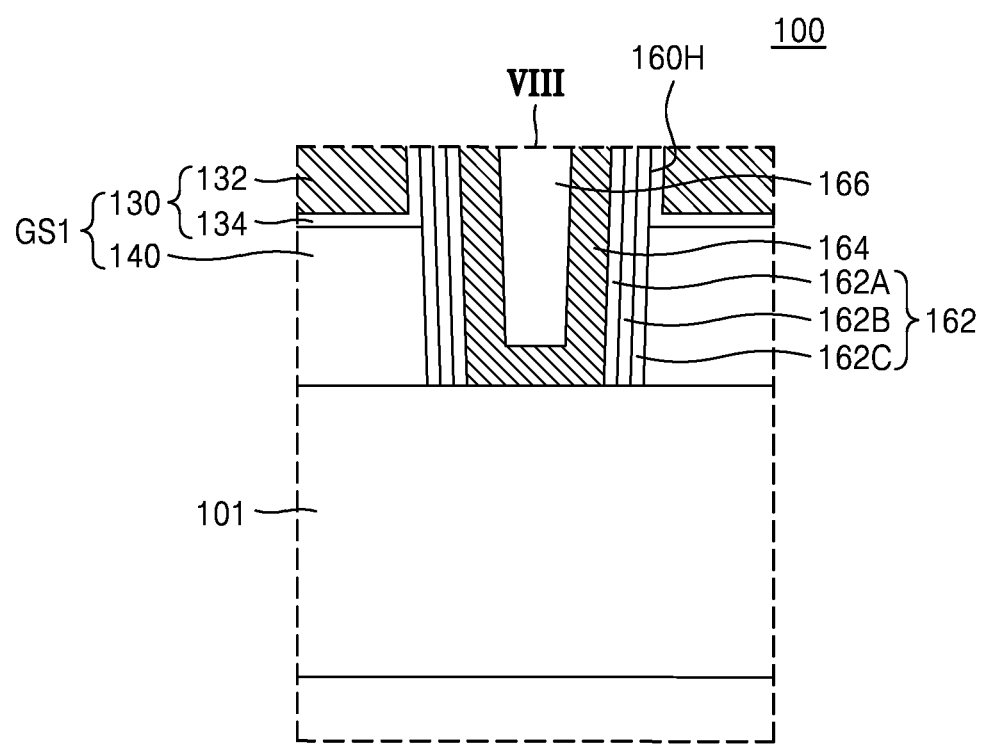
FIG. 8 is a magnified view of a portion VIII of FIG. 4.
Figure 9:
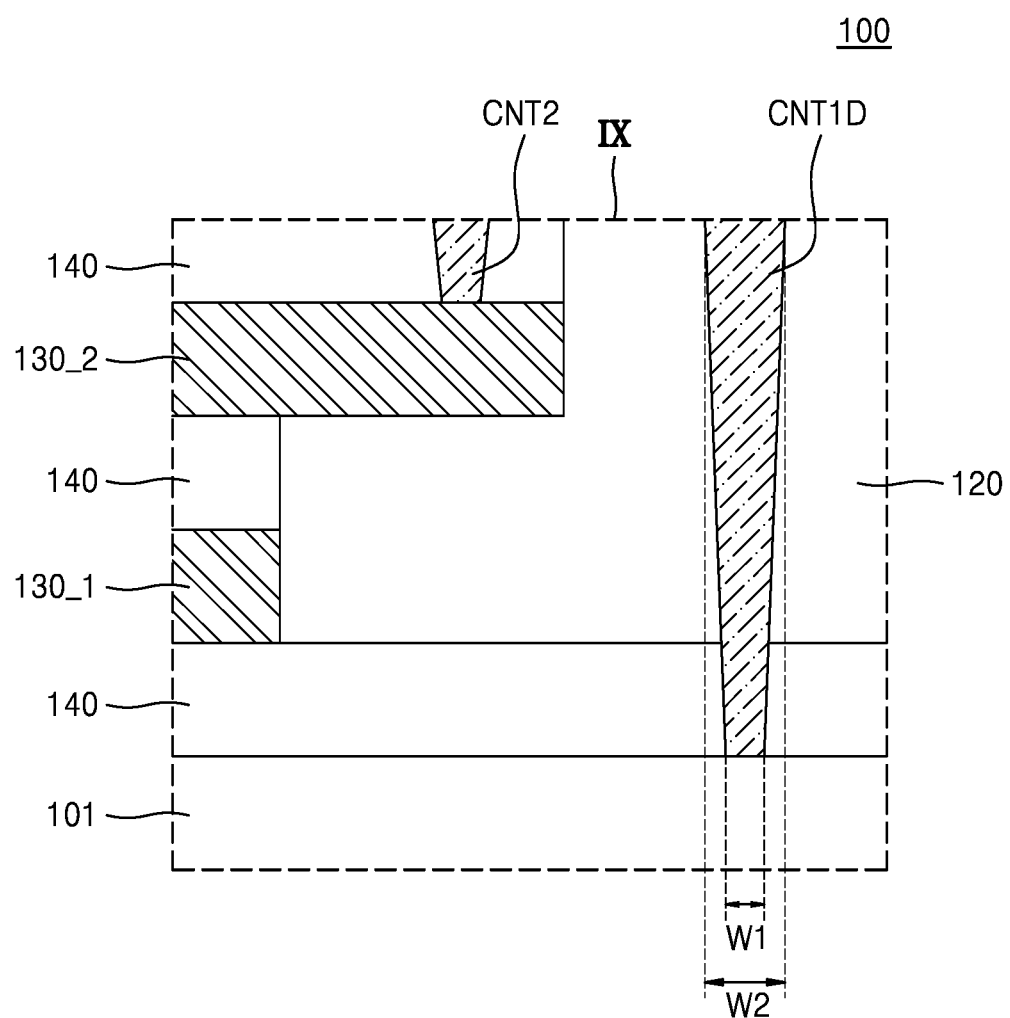
FIG. 9 is a magnified view of a portion IX of FIG. 4.

FIG. 3 is a top view of components in an integrated circuit device 100, according to an embodiment of the inventive concept, FIG. 4 is a cross-sectional view taken along line IV-IV' of FIG. 3, FIG. 5 is a cross-sectional view taken along line V-V of FIG. 3, FIG. 6 is a cross-sectional view taken along line VI-VI' of FIG. 3, FIG. 7 is a magnified view of a portion VII of FIG. 4, FIG. 8 is a magnified view of a portion VIII of FIG. 4, and FIG. 9 is a magnified view of a portion IX of FIG. 4.

Referring to FIGS. 3 to 9, the integrated circuit device 100 may include a cell array structure CS including a memory cell region MCR and a connection region CON.

The memory cell region MCR may be a region in which the memory cell array MCA of a NAND type vertical channel structure, which has been described above with reference to FIG. 2, is formed. The connection region CON may be a region in which a pad part PAD electrically connecting a peripheral circuit region (not shown) to the memory cell array MCA formed in the memory cell region MCR is formed.

A semiconductor substrate 101 may include a semiconductor material, e.g., a group IV semiconductor material, a group III-V compound semiconductor material, or a group II-VI oxide semiconductor material. For example, the group IV semiconductor material may include silicon (Si), germanium (Ge), or SiGe. The semiconductor substrate 101 may be provided as a bulk wafer, or a wafer having an epitaxial layer formed thereon. In other embodiments, the semiconductor substrate 101 may include a silicon on insulator (SOI) substrate or a germanium on insulator (GeOI) substrate.

A gate stack GS may extend on the semiconductor substrate 101 in a first horizontal direction (X direction) and a second horizontal direction (Y direction) parallel to a main surface of the semiconductor substrate 101. The gate stack GS may include a plurality of gate electrodes 130 and a plurality of insulating layers 140, and the plurality of gate electrodes 130 and the plurality of insulating layers 140 may be alternately stacked on an upper surface of the semiconductor substrate 101 in a vertical direction (Z direction). In addition, an upper insulating layer 150 may be on the top of the gate stack GS.

The gate electrode 130 may include a buried conductive layer 132 and an insulating liner 134 surrounding an upper surface, a lower surface, and side surfaces of the buried conductive layer 132. For example, the buried conductive layer 132 may include a metal such as tungsten, a metal silicide such as a tungsten silicide, doped polysilicon, or a combination thereof. In some embodiments, the insulating liner 134 may include a high-k material such as aluminum oxide.

The plurality of gate electrodes 130 may correspond to (e.g., may comprise/provide) the ground select line GSL, the word lines WL, and the at least one string select line SSL constituting the memory cell string MS described above with reference to FIG. 2. For example, the gate electrode 130 on the lowest layer among the plurality of gate electrodes 130 may function as the ground select line GSL, the gate electrode 130 on the highest layer among the plurality of gate electrodes 130 may function as the string select line SSL, and the other gate electrodes 130 may function as the word lines WL. Accordingly, the memory cell string MS in which the ground select transistor GST, the string select transistor SST, and the plurality of memory cell transistors MC1, MC2, ..., MCn−1, and MCn therebetween are connected in series may be provided.

Herein, for convenience of description, the gate electrode 130 on the lowest layer among the plurality of gate electrodes 130 is referred to as a first gate electrode 130_1, and the gate electrode 130 located in the second lowest layer among the plurality of gate electrodes 130 is referred to as a second gate electrode 130_2. That is, the first gate electrode 130_1 may function as the ground select line GSL, and the second gate electrode 130_2 may function as a word line WL. The first and second gate electrodes 130_1 and 130_2, however, are not limited thereto.

A plurality of word line cuts 170 may extend on the semiconductor substrate 101 in the first horizontal direction (X direction). The gate stack GS arranged between a pair of word line cuts 170 may constitute a block, and the pair of word line cuts 170 may limit a width of the gate stack GS in the second horizontal direction (Y direction). Accordingly, a plurality of gate stacks GS may be separated from each other in the second horizontal direction (Y direction) by word line cuts 170. The word line cut 170 may include an insulating spacer 172 and an insulating separation layer 174. That is, the word line cut 170 may include an insulating structure. A plurality of common source regions CSR may be formed in the semiconductor substrate 101. The plurality of common source regions CSR may be an impurity region in which impurities are doped at a high density.

A plurality of channel structures 160 may extend, in the memory cell region MCR, in the vertical direction (Z direction) from the upper surface of the semiconductor substrate 101 by passing through the plurality of gate electrodes 130. The plurality of channel structures 160 may be arranged to be separated by a certain (e.g., predetermined) distance from each other in the first horizontal direction (X direction) and the second horizontal direction (Y direction). The plurality of channel structures 160 may be arranged in a zigzag shape or a staggered shape.

Each of the plurality of channel structures 160 may be formed to extend inside a channel hole 160H passing through the gate stack GS. Each of the plurality of channel structures 160 may include a gate insulating layer 162, a channel layer 164, a buried insulating layer 166, and a conductive plug 168. The gate insulating layer 162 and the channel layer 164 may be sequentially arranged on a side wall of the channel hole 160H. For example, the gate insulating layer 162 may be conformally arranged on the side wall of the channel hole 160H, and the channel layer 164 may be conformally arranged on the side wall and a bottom part of the channel hole 160H. The buried insulating layer 166 in (e.g., filling) a remaining space of the channel hole 160H may be on the channel layer 164. The conductive plug 168 in contact with the channel layer 164 and blocking an entrance (e.g., the top) of the channel hole 160H may be at an upper side of the channel hole 160H. In other embodiments, the buried insulating layer 166 may be omitted, and the channel layer 164 may be formed in a pillar shape in (e.g., filling) a remaining part of the channel hole 160H.

The plurality of channel structures 160 may be in contact with the semiconductor substrate 101. In some embodiments, the channel layer 164 may be arranged to be in contact with the upper surface of the semiconductor substrate 101 at the bottom part of the channel hole 160H. In other embodiments, a contact semiconductor layer (not shown) having a certain (e.g., predetermined) height may be formed on the semiconductor substrate 101 at the bottom part of the channel hole 160H, and the channel layer 164 may be electrically connected to the semiconductor substrate 101 through the contact semiconductor layer.

The gate insulating layer 162 may have a structure sequentially including a tunneling dielectric layer 162A, a charge storage layer 162B, and a blocking dielectric layer 162C on an outer wall of the channel layer 164. Relative thicknesses of the tunneling dielectric layer 162A, the charge storage layer 162B, and the blocking dielectric layer 162C constituting the gate insulating layer 162 are not limited to those shown in FIGS. 7 and 8 and may be variously changed.

The tunneling dielectric layer 162A may include silicon oxide, hafnium oxide, aluminum oxide, zirconium oxide, tantalum oxide, or the like. The charge storage layer 162B is a region in which electrons, which have passed through the tunneling dielectric layer 162A from the channel layer 164, may be stored, and may include silicon nitride, boron nitride, silicon boron nitride, or impurity-doped polysilicon. The blocking dielectric layer 162C may include silicon oxide, silicon nitride, or metal oxide having a higher dielectric constant than silicon oxide.

In one block, the gate electrode 130 on the highest layer among the plurality of gate electrodes 130 may be divided into two parts by a string separation insulating layer (not shown) in a top view. The two parts may constitute the string select lines SSL described above with reference to FIG. 2.

In the connection region CON, an end portion of a gate electrode 130 may be referred to as a pad part PAD, and a cover insulating layer 120 covering at least one side surface of the pad part PAD may be arranged. In the connection region CON, the plurality of gate electrodes 130 may extend to have a length gradually decreasing in the first horizontal direction (X direction) while moving away from the upper surface of the semiconductor substrate 101 in the vertical direction (Z direction). That is, in the connection region CON, the plurality of gate electrodes 130 may have a stair structure.

In the integrated circuit device 100 according to the inventive concept, end portions of the plurality of gate electrodes 130 in the connection region CON may have a concave-convex shape in the second horizontal direction (Y direction) in a top view. The concave-convex shape may alternately have a protrusion part and a depressed part in a rectangular shape. That is, the connection region CON may include a first part CON1 in which gate electrodes 130 are formed to be relatively short in the first horizontal direction (X direction) and a second part CON2 in which gate electrodes 130 are formed to be relatively long in the first horizontal direction (X direction). Accordingly, the gate electrodes 130 are longer, in the first horizontal direction (X direction), in the second part CON2 than in the first part CON1. The second part CON2 and the first part CON1 alternate with each other in the second horizontal direction (Y direction). Respective first gate electrodes 130_1 of a plurality of gate stacks GS are the lowermost ones of the gate electrodes 130 of those gate stacks GS. As shown in FIGS. 3-5, the lowermost one of the gate electrodes 130 in a gate stack GS that is in the first part CON1 of the connection region CON is shorter, in the first horizontal direction (X direction), than the lowermost one of the gate electrodes 130 in another gate stack GS that is in the second part CON2 of the connection region CON.

In the connection region CON, a contact plug CNT connected to the pad part PAD of the gate electrode 130 by passing through the cover insulating layer 120 and an insulating layer 140 may be in a contact hole CNTH. The contact plug CNT may have a tapered pillar shape having a width gradually decreasing toward the semiconductor substrate 101 in the vertical direction (Z direction) from an upper region to a lower region. That is, a width W1 of a lower surface of the contact plug CNT may be less than a width W2 of an upper surface thereof. This may be a feature applied to all contact plugs CNT on the main (e.g., upper) surface of the semiconductor substrate 101.

Herein, the contact plug CNT may be divided into first and second contact plugs CNT1 and CNT2 according to arranged positions thereof. That is, the contact plug CNT may include the first contact plug CNT1 in contact with the lowest layer of the stair structure and a plurality of second contact plugs CNT2 that are between, in the X direction, the first contact plug CNT1 and the memory cell region MCR. In other words, a horizontal distance between the memory cell region MCR and the first contact plug CNT1 may be greater than a horizontal distance between the memory cell region MCR and the plurality of second contact plugs CNT2.

In addition, the first contact plug CNT1 may be divided into a dummy contact plug CNT1D and a ground contact plug CNT1G, again according to arranged positions thereof. The dummy contact plug CNT1D may be in direct (i.e., physical) contact with the semiconductor substrate 101 without being in direct contact with the first gate electrode 130_1. Unlike this, the ground contact plug CNT1G may be in direct contact with the first gate electrode 130_1 and may not be in contact with the semiconductor substrate 101.

That is, a first height H1 of the dummy contact plug CNT1D in the vertical direction (Z direction) may be greater than a second height H2 of the ground contact plug CNT1G in the vertical direction (Z direction). Accordingly, in the first part CON1 of the connection region CON, a side wall of an end portion of each of the first and second gate electrodes 130_1 and 130_2 may be arranged to face a side wall of the first contact plug CNT1. Unlike this, in the second part CON2 of the connection region CON, the side wall of the end portion of the second gate electrode 130_2 may face the side wall of the first contact plug CNT1, but the side wall of the end portion of the first gate electrode 130_1 may not face the side wall of the first contact plug CNT1.

In the integrated circuit device 100 according to the inventive concept, in the first part CON1 of the connection region CON, a first length 130_1L1 of the first gate electrode 130_1, which is located in the lowest layer among the plurality of gate electrodes 130, in the first horizontal direction (X direction) may be less than a second length 130_2L1 of the second gate electrode 130_2, which is located directly above the first gate electrode 130_1, in the first horizontal direction (X direction). Unlike this, in the second part CON2 of the connection region CON, a first length 130_1L2 of the first gate electrode 130_1 (a lowermost one of the gate electrodes 130 in the second part CON2) in the first horizontal direction (X direction) may be greater than a second length 130_2L2 of the second gate electrode 130_2 (a next-lowermost one of the gate electrodes 130 in the second part CON2) in the first horizontal direction (X direction).

A bit line contact BLC may be in contact with the conductive plug 168 of the channel structure 160 by passing through the upper insulating layer 150, and a bit line BL in contact with the bit line contact BLC may extend on the upper insulating layer 150 in the second horizontal direction (Y direction). In addition, in the connection region CON, a conductive line ML may be formed on the upper insulating layer 150. Although not shown, an upper support layer may be further formed between the upper insulating layer 150 and the bit line BL and between the upper insulating layer 150 and the conductive line ML. In some embodiments, the conductive line ML may be electrically connected to an upper surface of the ground contact plug CNT1G. Unlike this, the conductive line ML may not be connected to an upper surface of the dummy contact plug CNT1D. That is, the dummy contact plug CNT1D may be in a floating state.

Recently, as a height of the gate stack GS increases, an aspect ratio of the contact plug CNT, i.e., a ratio of a height of the contact plug CNT to a width of the contact plug CNT, may increase. In particular, in a structure in which the gate stack GS includes multiple gate electrodes 130, the aspect ratio of the contact plug CNT may be larger. Accordingly, an aspect ratio of the first contact plug CNT1 in contact with the first gate electrode 130_1 may be greater than an aspect ratio of each of the plurality of second contact plugs CNT2.

In a vertical memory device having a general three-dimensional structure, a dummy contact plug may be arranged even on a part, which does not need a contact plug, in a connection region to sufficiently/efficiently perform a photolithography process and an etching process. However, as a semiconductor manufacturing process may be very complicated, there may occur an undesired phenomenon that some dummy contact plugs are in direct contact with a semiconductor substrate by completely passing through a gate electrode (e.g., a ground select line) on the lowest layer among a plurality of gate electrodes. In this case, there may be a problem that a leakage current flows from the gate electrode on the lowest layer among the plurality of gate electrodes to the semiconductor substrate through the dummy contact plugs.

To solve this problem, the integrated circuit device 100 according to the inventive concept may be designed to completely separate the dummy contact plug CNT1D from the first gate electrode 130_1 by forming the first gate electrode 130_1 to have a relatively short horizontal length in the first part CON1 of the connection region CON in which the dummy contact plug CNT1D is arranged.

By doing this, in the integrated circuit device 100, the problem of a leakage current, which may occur when some dummy contact plugs CNT1D pass through the first gate electrode 130_1, may be inhibited/prevented in advance.

The integrated circuit device 100 according to the inventive concept may sufficiently/efficiently suppress a fault such as a leakage current, and thus, difficulty of a manufacturing process may be reduced, and the reliability of a product may be improved.

FIGS. 10 to 13 are cross-sectional views of integrated circuit devices 200, 300, 400, and 500 according to other embodiments of the inventive concept.

Most components constituting the integrated circuit devices 200, 300, 400, and 500 described below and materials forming the components may be substantially the same as or similar to those of the integrated circuit device 100 described above with reference to FIGS. 3 to 9. Therefore, for convenience of description, differences from the integrated circuit device 100 described above are mainly described.

Figure 10:
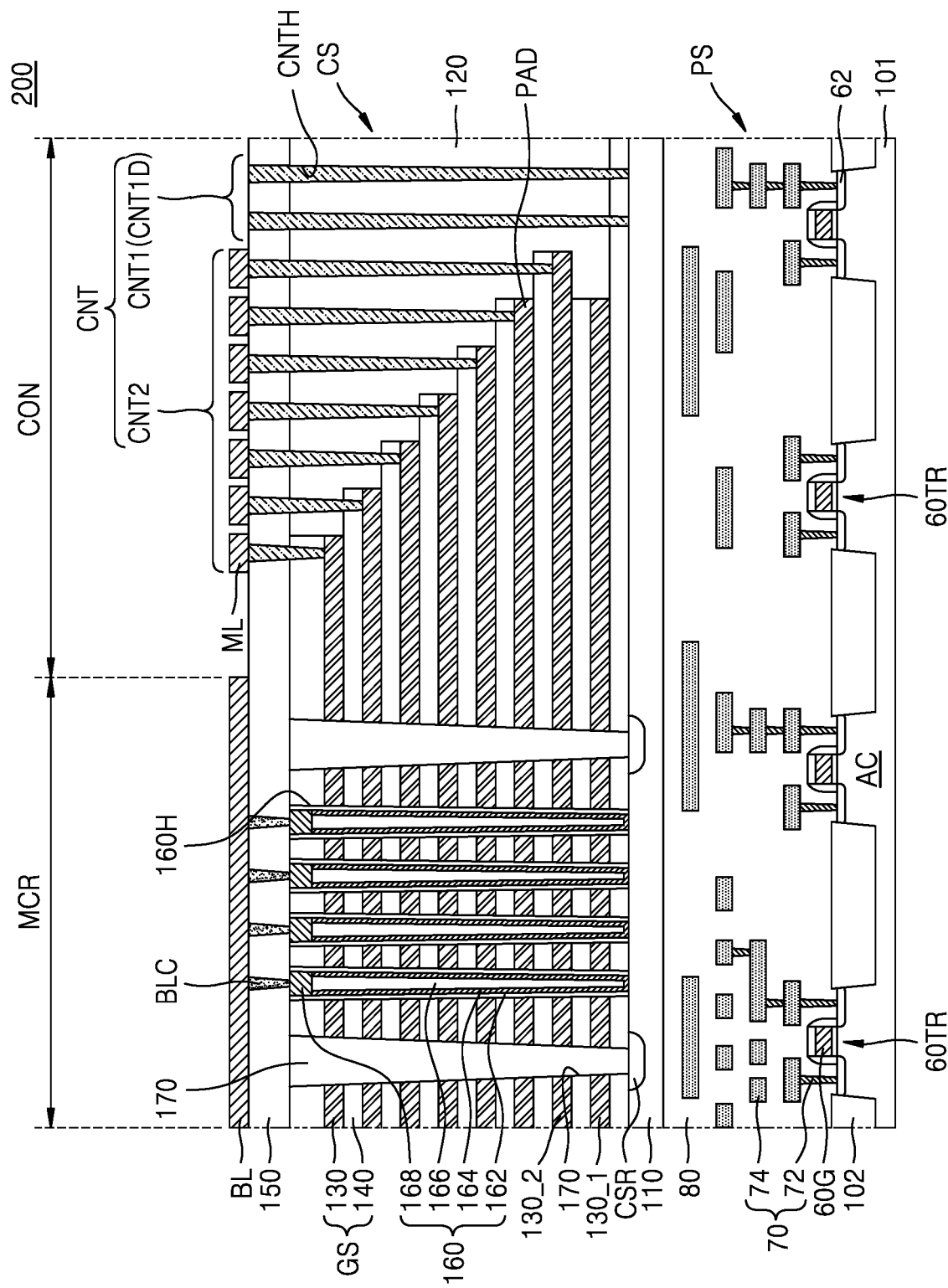
FIGS. 10 to 13 are cross-sectional views of integrated circuit devices according to other embodiments of the inventive concept.

Referring to FIG. 10, the integrated circuit device 200 may include a peripheral circuit structure PS and the cell array structure CS arranged on a vertical level that is higher than that of the peripheral circuit structure PS.

The integrated circuit device 200 according to the present embodiment may have a cell on periphery (COP) structure in which the cell array structure CS is above the peripheral circuit structure PS. A base structure 110 may be between the peripheral circuit structure PS and the cell array structure CS.

The peripheral circuit structure PS may include a peripheral circuit transistor 60TR and a peripheral circuit wiring 70 on the semiconductor substrate 101. In the semiconductor substrate 101, an active region AC may be defined by a device separation layer 102, and a plurality of peripheral circuit transistors 60TR may be formed on the active region AC. Each of the plurality of peripheral circuit transistors 60TR may include a peripheral circuit gate 60G and a source/drain region 62 arranged in a portion of the semiconductor substrate 101 at opposite sides of the peripheral circuit gate 60G.

The peripheral circuit wiring 70 includes a plurality of peripheral circuit contacts 72 and a plurality of peripheral circuit metal layers 74. An interlayer insulating layer 80 covering the peripheral circuit transistor 60TR and the peripheral circuit wiring 70 may be on the semiconductor substrate 101. The plurality of peripheral circuit metal layers 74 may have a multi-layer structure including a plurality of metal layers on different vertical levels. Although FIG. 10 shows that all the plurality of peripheral circuit metal layers 74 are formed to have the same height, a peripheral circuit metal layer 74 on a certain level (e.g., on the highest level) may be formed to be higher than the peripheral circuit metal layers 74 on the other levels.

In the present embodiment, the dummy contact plug CNT1D may be completely separated from the first gate electrode 130_1 by forming the first gate electrode 130_1 to have a relatively short horizontal length in the connection region CON in which the dummy contact plug CNT1D in the first contact plug CNT1 is arranged.

By doing this, in the integrated circuit device 200, the problem of a leakage current, which may occur when some dummy contact plugs CNT1D pass through the first gate electrode 130_1, may be inhibited/prevented in advance.

The integrated circuit device 200 according to the inventive concept may sufficiently/efficiently suppress a fault such as a leakage current, and thus, difficulty of a manufacturing process may be reduced, and the reliability of a product may be improved.

Figure 11:
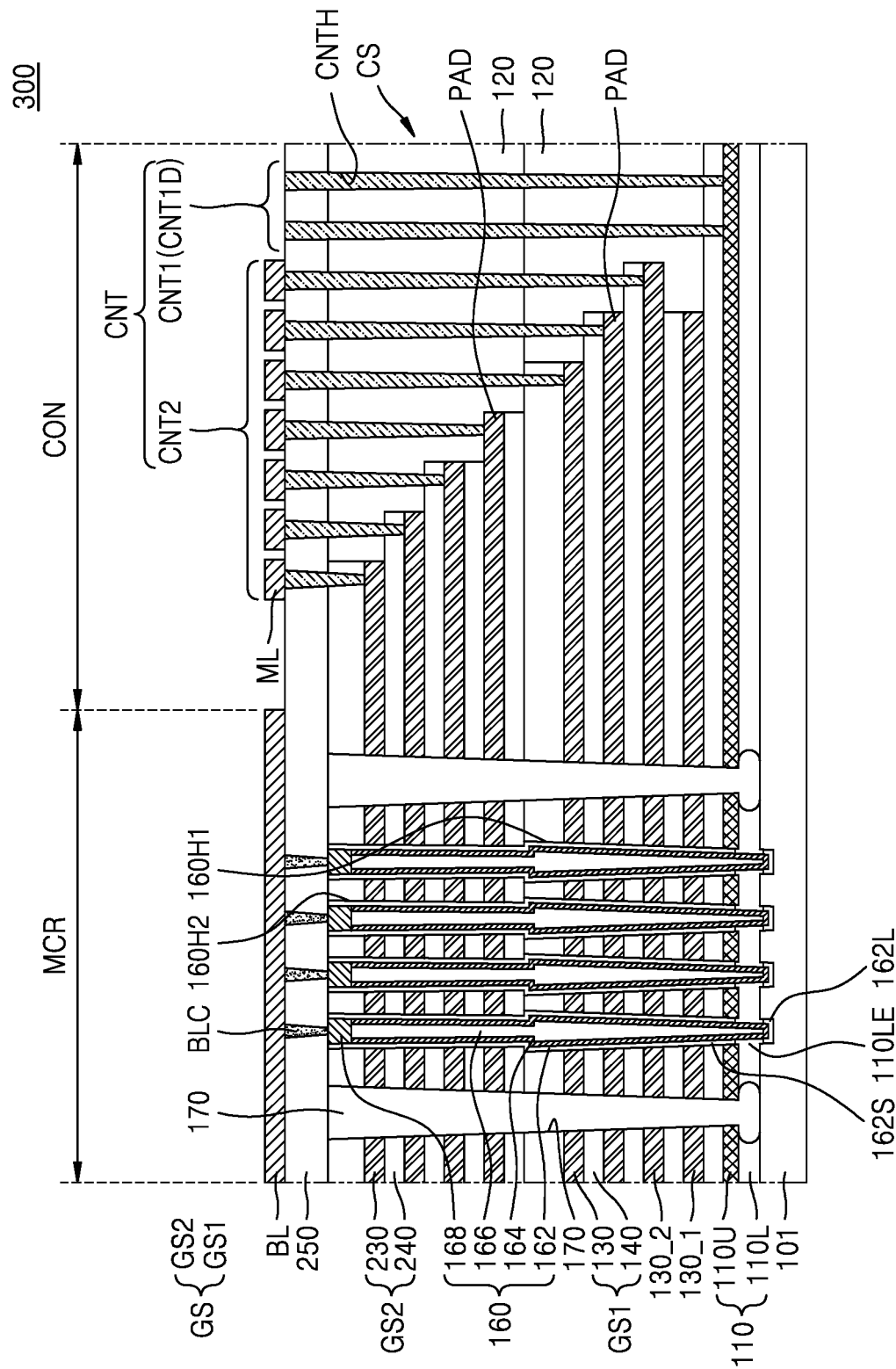

Referring to FIG. 11, the integrated circuit device 300 may include a first gate stack GS1 at a lower part thereof and a second gate stack GS2 at an upper part thereof.

In the integrated circuit device 300 of the present embodiment, the first gate stack GS1 may include a plurality of first gate electrodes 130 and a plurality of first insulating layers 140, and the plurality of first gate electrodes 130 and the plurality of first insulating layers 140 may be alternately arranged in the vertical direction (Z direction) orthogonal to on an upper surface of the base structure 110. In addition, a first upper insulating layer 150 may be on the top of the first gate stack GS1.

The second gate stack GS2 may include a plurality of second gate electrodes 230 and a plurality of second insulating layers 240, and the plurality of second gate electrodes 230 and the plurality of second insulating layers 240 may be alternately arranged above the first gate stack GS1 in the vertical direction (Z direction). In addition, a second upper insulating layer 250 may be on the top of the second gate stack GS2. In addition, in the connection region CON, the first gate stack GS1 may have a first stair structure, and the second gate stack GS2 may have a second stair structure.

Each of the plurality of channel structures 160 may be formed to extend inside a first channel hole 160H1 passing through the first gate stack GS1 and inside a second channel hole 160H2 passing through the second gate stack GS2. Each of the plurality of channel structures 160 may have a shape protruding outward at a boundary part between the first channel hole 160H1 and the second channel hole 160H2.

The plurality of channel structures 160 may be in contact with the semiconductor substrate 101 by passing through the base structure 110 including an upper base layer 110U and a lower base layer 110L. On the same level as the lower base layer 110L, a portion of the gate insulating layer 162 may be removed, and the channel layer 164 may be in contact with an extension part 110LE of the lower base layer 110L. A side wall part 162S and a bottom part 162L of the gate insulating layer 162 are separated from each other with the extension part 110LE of the lower base layer 110L therebetween, and the bottom part 162L of the gate insulating layer 162 is arranged to surround a bottom surface of the channel layer 164. Therefore, the channel layer 164 may be electrically connected to the lower base layer 110L instead of being in direct contact with the semiconductor substrate 101.

In the present embodiment, the dummy contact plug CNT1D may be completely separated from the first gate electrode 130_1 by forming the first gate electrode 130_1 corresponding to (e.g., comprising/providing) a ground select line to have a relatively short horizontal length in the connection region CON in which the dummy contact plug CNT1D in the first contact plug CNT1 is arranged.

By doing this, in the integrated circuit device 300, the problem of a leakage current, which may occur when some dummy contact plugs CNT1D pass through the first gate electrode 130_1, may be inhibited/prevented in advance.

The integrated circuit device 300 according to the inventive concept may sufficiently/efficiently suppress a fault such as a leakage current, and thus, difficulty of a manufacturing process may be reduced, and the reliability of a product may be improved.

Figure 12:
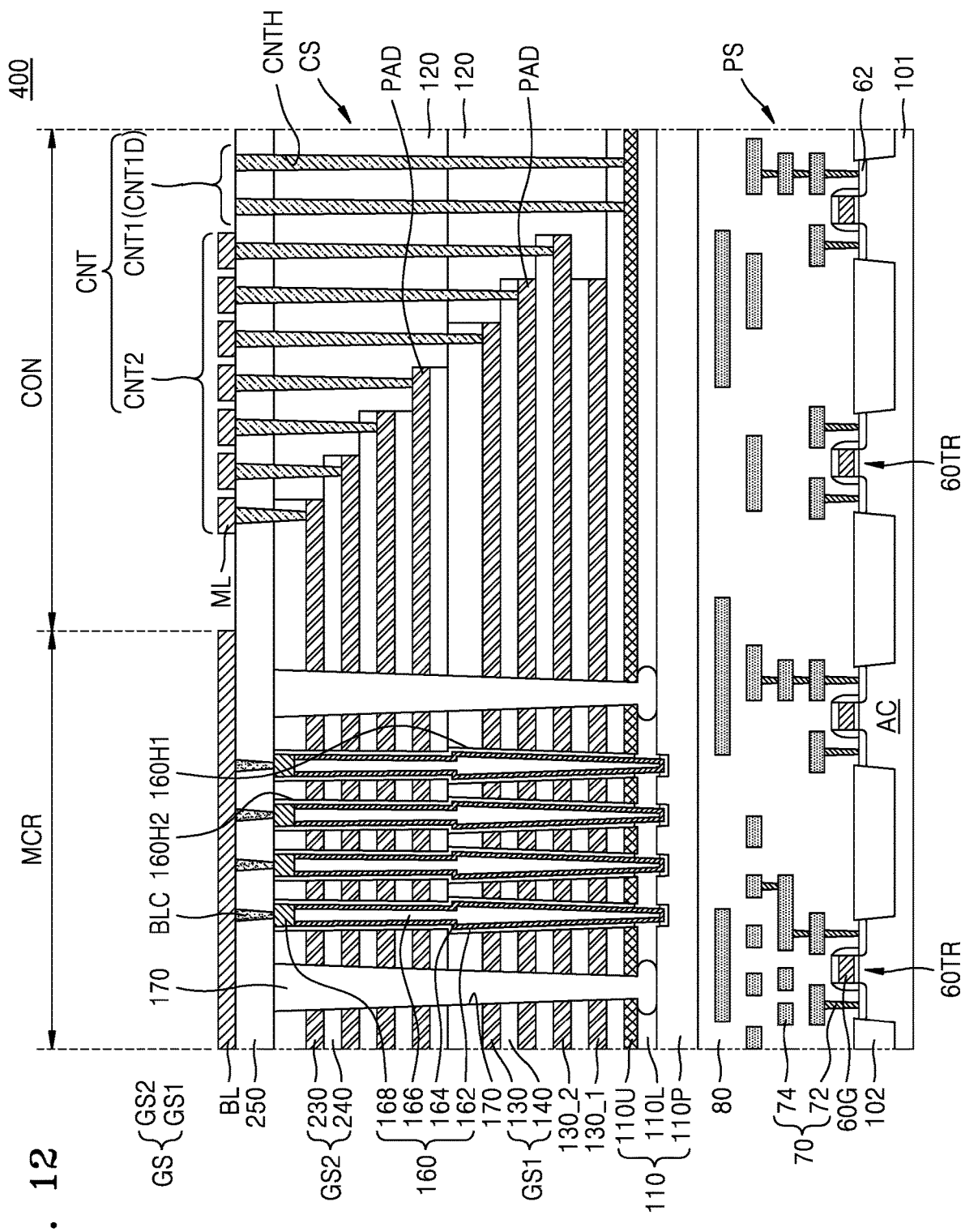

Referring to FIG. 12, the integrated circuit device 400 may include the peripheral circuit structure PS and the first and second gate stacks GS1 and GS2 on vertical levels that are higher than that of the peripheral circuit structure PS.

Because the integrated circuit device 400 according to the present embodiment has the features of the integrated circuit device 200 (see FIG. 10) and the integrated circuit device 300 (see FIG. 11) together, a detailed description thereof is omitted herein. Moreover, FIG. 12 shows that the base structure 110 includes a primary base layer 110P that is under the upper base layer 110U and the lower base layer 110L. The primary base layer 110P may be vertically thicker than each of the upper base layer 110U and the lower base layer 110L.

Figure 13:
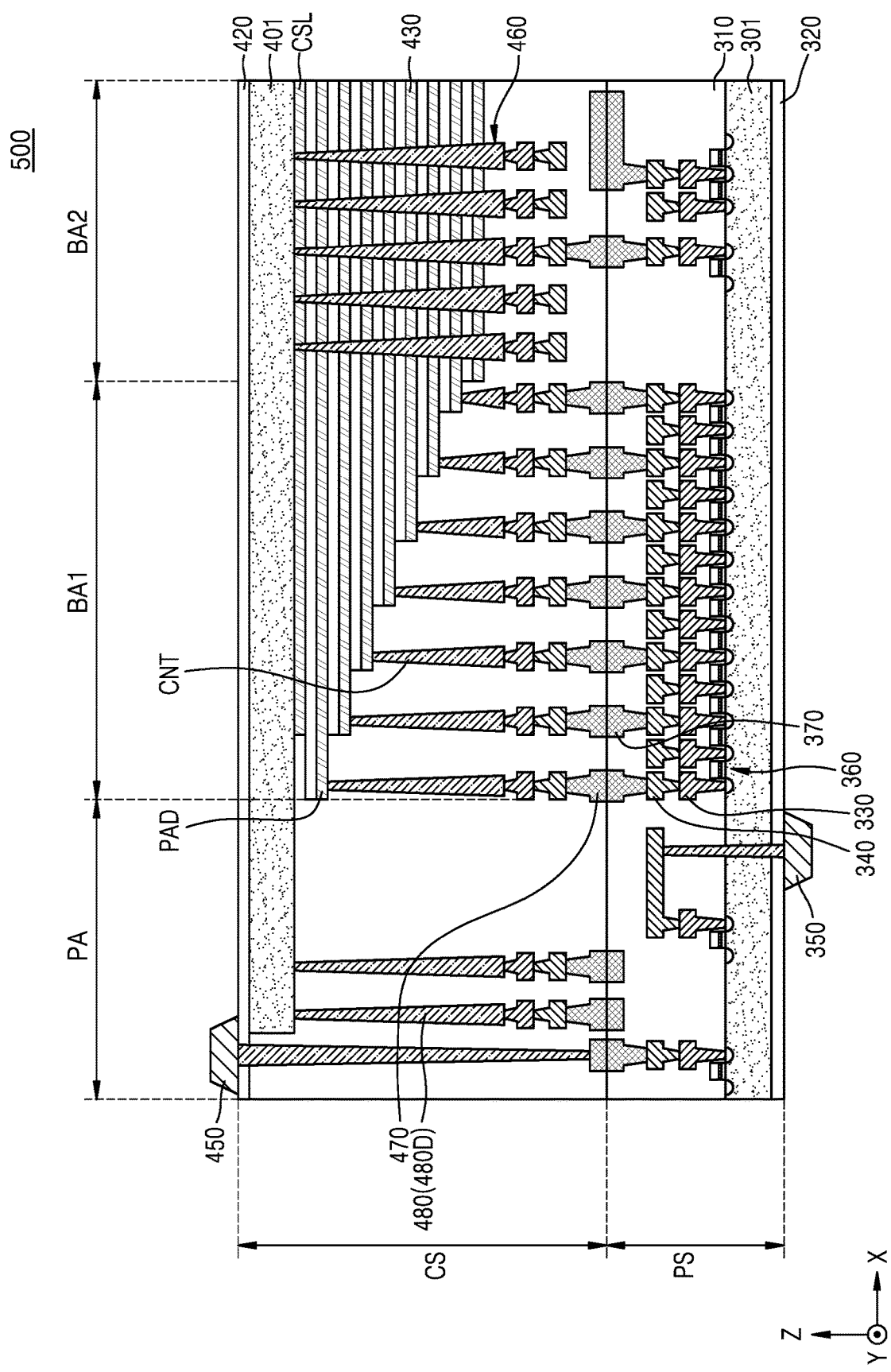

Referring to FIG. 13, the integrated circuit device 500 may include a chip to chip structure.

The integrated circuit device 500 according to the present embodiment includes a chip to chip structure in which an upper chip including the cell array structure CS is manufactured, a lower chip in which the peripheral circuit structure PS is manufactured, and then the upper chip and the lower chip are connected to each other by a bonding scheme.

In some embodiments, the bonding scheme may be a scheme in which bonding pads formed on the top of the upper chip are in contact with bonding pads formed on the top of the lower chip. The bonding scheme may include a metal-metal structure, a through silicon via (TSV), a back via stack (BVS), a eutectic bonding structure, a ball grid array (BGA) bonding structure, a plurality of wiring lines, or a combination thereof.

The peripheral circuit structure PS may include a circuit board 301, an interlayer insulating layer 310, a plurality of circuit elements 360, a first metal layer 330 connected to each of the plurality of circuit elements 360, and a second metal layer 340 formed on the first metal layer 330.

The interlayer insulating layer 310 is on the circuit board 301 to cover the plurality of circuit elements 360, the first metal layer 330, and the second metal layer 340 and may include an insulating material.

A lower bonding pad 370 may be formed on the second metal layer 340 in a word line bonding area BA1. In the word line bonding area BA1, the lower bonding pad 370 of the peripheral circuit structure PS may be electrically connected to an upper bonding pad 470 of the cell array structure CS by the bonding scheme.

The cell array structure CS may provide at least one memory block. The cell array structure CS may include a cell substrate 401 and the common source line CSL. A plurality of word lines 430 may be stacked above the cell substrate 401 in the vertical direction (Z direction).

In a bit line bonding area BA2, a channel structure 460 may pass through the plurality of word lines 430, string select lines, and a ground select line in the vertical direction (Z direction).

In the word line bonding area BA1, the plurality of word lines 430 may extend in parallel to an upper surface of the cell substrate 401 and may be connected to a plurality of contact plugs CNT. The plurality of word lines 430 and the plurality of contact plugs CNT may be connected to each other through pad parts PAD provided as at least portions of the plurality of word lines 430, which extend by different lengths.

In an external pad bonding area PA, a common source line contact 480 may be arranged. The common source line contact 480 may include a conductive material such as a metal, a metal compound, or polysilicon and may be electrically connected to the common source line CSL.

In addition, in the external pad bonding area PA, first and second input-output pads 350 and 450 may be arranged. A lower layer 320 covering a lower surface of the circuit board 301 may be formed under the circuit board 301, and the first input-output pad 350 may be formed on the lower layer 320. An upper layer 420 covering an upper surface of the cell substrate 401 may be formed on the cell substrate 401, and the second input-output pad 450 may be on the upper layer 420.

In the present embodiment, the common source line CSL may have a relatively short horizontal length in the external pad bonding area PA in which a dummy contact 480D among common source line contacts 480 is arranged, so that the dummy contact 480D is completely separated from the common source line CSL.

By doing this, in the integrated circuit device 500, the problem of a leakage current, which may occur when some dummy contacts 480D among the common source line contacts 480 pass through the common source line CSL, may be inhibited/prevented in advance.

The integrated circuit device 500 according to the inventive concept may sufficiently/efficiently suppress a fault such as a leakage current, and thus, difficulty of a manufacturing process may be reduced, and the reliability of a product may be improved.

Figure 14:
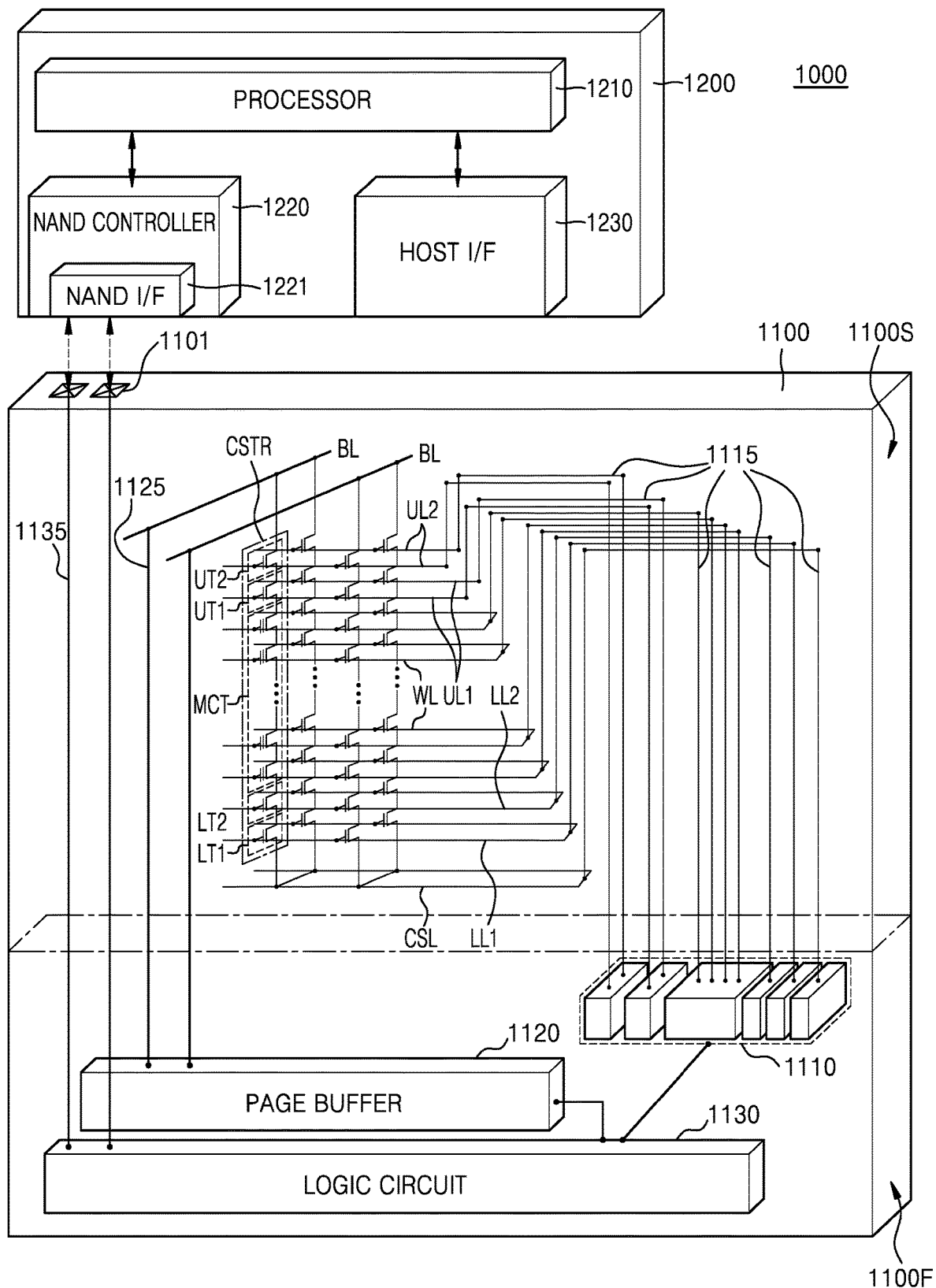
FIG. 14 is a block diagram of an electronic system including an integrated circuit device, according to an embodiment of the inventive concept.

FIG. 14 is a block diagram of an electronic system 1000 including an integrated circuit device 1100, according to an embodiment of the inventive concept.

Referring to FIG. 14, the electronic system 1000 may include the integrated circuit device 1100 and a controller 1200 electrically connected to the integrated circuit device 1100.

The electronic system 1000 may be a storage device including one or more integrated circuit devices 1100, or an electronic device including the storage device. For example, the electronic system 1000 may be a solid state drive (SSD) device, a universal serial bus (USB) device, a computing system, a medical device, or a communication device including at least one integrated circuit device 1100.

The integrated circuit device 1100 may be a nonvolatile vertical memory device. For example, the integrated circuit device 1100 may be a NAND flash memory device including at least one of the integrated circuit devices 100, 200, 300, 400, and 500 described with reference to FIGS. 3 to 13. The integrated circuit device 1100 may include a first structure 1100F and a second structure 1100S on the first structure 1100F. In some embodiments, the first structure 1100F may be beside the second structure 1100S.

The first structure 1100F may be a peripheral circuit structure including a decoder circuit 1110, a page buffer 1120, and a logic circuit 1130. The second structure 1100S may be a memory cell structure including the plurality of bit lines BL, the common source line CSL, the plurality of word lines WL, first and second gate upper lines UL1 and UL2, first and second gate lower lines LL1 and LL2, and a plurality of memory cell strings CSTR between the plurality of bit lines BL and the common source line CSL.

In the second structure 1100S, each of the plurality of memory cell strings CSTR may include lower transistors LT1 and LT2 adjacent to the common source line CSL, upper transistors UT1 and UT2 adjacent to a bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously modified according to embodiments.

In some embodiments, the upper transistors UT1 and UT2 may include a string select transistor, and the lower transistors LT1 and LT2 may include a ground select transistor. The first and second gate lower lines LL1 and LL2 may be gate electrodes of the lower transistors LT1 and LT2, respectively. A word line WL may be a gate electrode of a memory cell transistor MCT, and the first and second gate upper lines UL1 and UL2 may be gate electrodes of the upper transistors UT1 and UT2, respectively.

The common source line CSL, the first and second gate lower lines LL1 and LL2, the plurality of word lines WL, and the first and second gate upper lines UL1 and UL2 may be electrically connected to the decoder circuit 1110 through a plurality of first connection wirings 1115 extending from the inside of the first structure 1100F to the second structure 1100S. The plurality of bit lines BL may be electrically connected to the page buffer 1120 through a plurality of second connection wirings 1125 extending from the inside of the first structure 1100F to the second structure 1100S.

In the first structure 1100F, the decoder circuit 1110 and the page buffer 1120 may execute a control operation on at least one of the plurality of memory cell transistors MCT. The decoder circuit 1110 and the page buffer 1120 may be controlled by the logic circuit 1130.

The integrated circuit device 1100 may communicate with the controller 1200 through input-output pads 1101 electrically connected to the logic circuit 1130. The input-output pads 1101 may be electrically connected to the logic circuit 1130 through input-output connection wirings 1135 extending from the inside of the first structure 1100F to the second structure 1100S.

The controller 1200 may include a processor 1210, a NAND controller 1220, and a host interface (I/F) 1230. In some embodiments, the electronic system 1000 may include a plurality of integrated circuit devices 1100, and in this case, the controller 1200 may control the plurality of integrated circuit devices 1100.

The processor 1210 may control a general operation of the electronic system 1000 including the controller 1200. The processor 1210 may operate according to certain firmware and control the NAND controller 1220 to access the integrated circuit device 1100. The NAND controller 1220 may include a NAND interface 1221 configured to process communication with the integrated circuit device 1100. Through the NAND interface 1221, a control command for controlling the integrated circuit device 1100, data to be written on the plurality of memory cell transistors MCT in the integrated circuit device 1100, data read from the plurality of memory cell transistors MCT in the integrated circuit device 1100, and the like may be transferred. The host interface 1230 may provide a communication function between the electronic system 1000 and an external host. When a control command is received from the external host through the host interface 1230, the processor 1210 may control the integrated circuit device 1100 in response to the control command.

Figure 15:
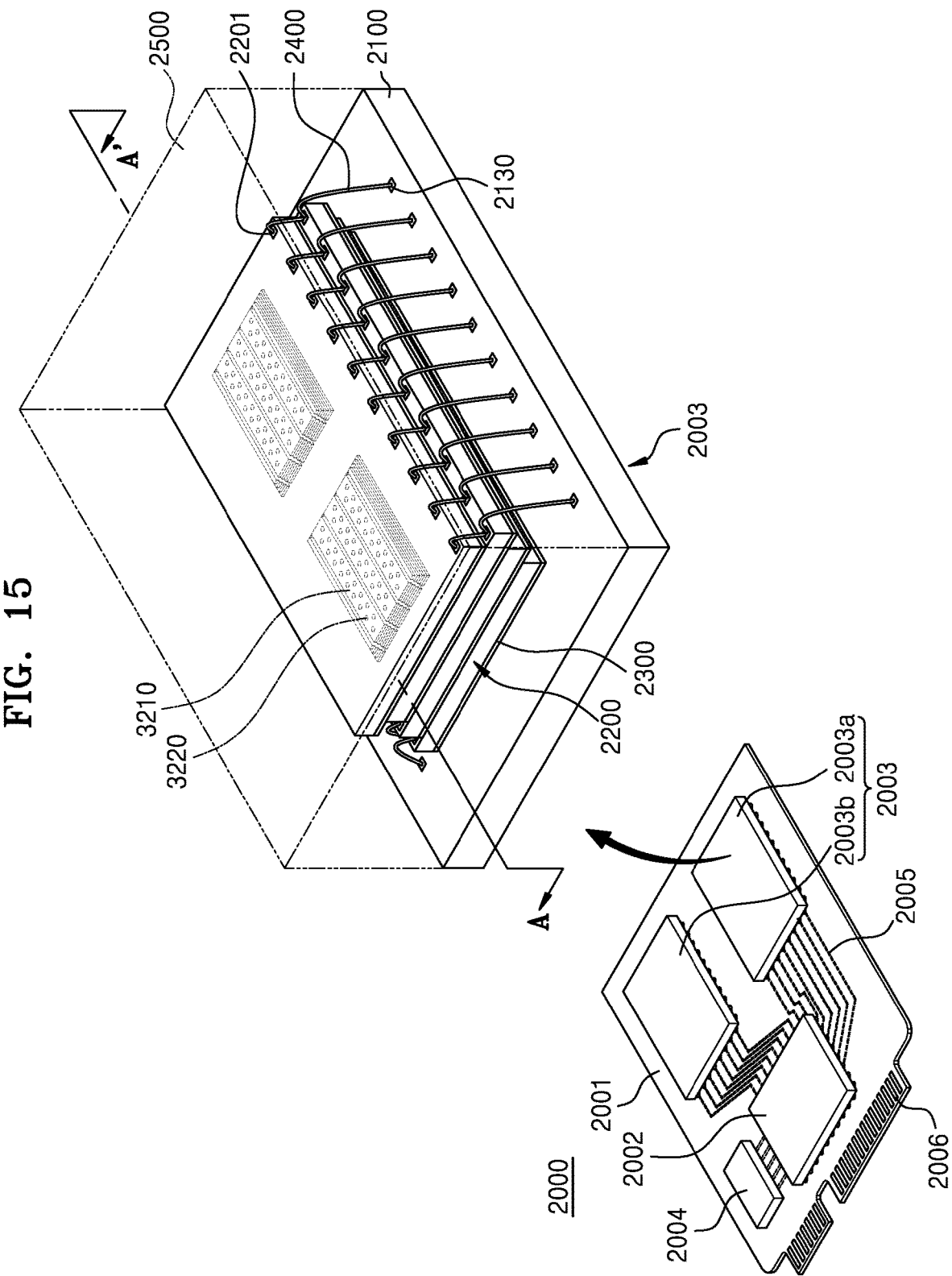
FIG. 15 is a perspective view of an electronic system including an integrated circuit device, according to an embodiment of the inventive concept.

FIG. 15 is a perspective view of an electronic system 2000 including an integrated circuit device, according to an embodiment of the inventive concept.

Referring to FIG. 15, the electronic system 2000 according to an embodiment of the inventive concept may include a main substrate 2001 and a controller 2002, a semiconductor package 2003, and dynamic random access memory (DRAM) 2004 mounted on the main substrate 2001.

The main substrate 2001 may include a connector 2006 including a plurality of pins coupled to an external host. The number and the arrangement of pins in the connector 2006 may vary according to a communication interface between the electronic system 2000 and the external host. In some embodiments, the electronic system 2000 may communicate with the external host according to any one of interfaces such as a USB interface, a peripheral component interconnect express (PCI-Express) interface, a serial advanced technology attachment (SATA) interface, and an M-Phy interface for a universal flash storage (UFS). In some embodiments, the electronic system 2000 may operate by power received from the external host through the connector 2006. The electronic system 2000 may further include a power management integrated circuit (PMIC) configured to distribute the power received from the external host to the controller 2002 and the semiconductor package 2003. The semiconductor package 2003 and the DRAM 2004 may be connected to each other by a plurality of wiring patterns 2005 formed on the main substrate 2001.

The controller 2002 may write or read data on or from the semiconductor package 2003 and improve an operating speed of the electronic system 2000.

The DRAM 2004 may be a buffer memory configured to mitigate a speed difference between the semiconductor package 2003, which is a data storage space, and the external host. The DRAM 2004 included in the electronic system 2000 may operate as a kind of cache memory and provide a space in which data is temporarily stored in a control operation on the semiconductor package 2003. When the DRAM 2004 is included in the electronic system 2000, the controller 2002 may further include a DRAM controller configured to control the DRAM 2004 in addition to a NAND controller configured to control the semiconductor package 2003.

The semiconductor package 2003 may include first and second semiconductor packages 2003a and 2003b separated from each other. Each of the first and second semiconductor packages 2003a and 2003b may include a plurality of semiconductor chips 2200. Each of the first and second semiconductor packages 2003a and 2003b may include a package substrate 2100, the plurality of semiconductor chips 2200 on the package substrate 2100, an adhesive layer 2300 beneath each of the plurality of semiconductor chips 2200, a plurality of connection structures 2400 electrically connecting the plurality of semiconductor chips 2200 to the package substrate 2100, and a molding layer 2500 covering the plurality of semiconductor chips 2200 and the plurality of connection structures 2400 on the package substrate 2100.

The package substrate 2100 may be a printed circuit board including a plurality of package upper pads 2130. Each of the plurality of semiconductor chips 2200 may include input-output pads 2201. The input-output pads 2201 may correspond to the input-output pads 1101 of FIG. 14. Each of the plurality of semiconductor chips 2200 may include a plurality of gate stacks 3210 and a plurality of channel structures 3220. Each of the plurality of semiconductor chips 2200 may include at least one of the integrated circuit devices 100, 200, 300, 400, and 500 described above with reference to FIGS. 3 to 13.

In some embodiments, the plurality of connection structures 2400 may be bonding wires electrically connecting the input-output pads 2201 to the plurality of package upper pads 2130. Therefore, in the first and second semiconductor packages 2003a and 2003b, the plurality of semiconductor chips 2200 may be electrically connected to each other by a bonding wire scheme and electrically connected to the plurality of package upper pads 2130 of the package substrate 2100. In some embodiments, in the first and second semiconductor packages 2003a and 2003b, the plurality of semiconductor chips 2200 may be electrically connected to each other through a connection structure including TSVs instead of the plurality of connection structures 2400 of the bonding wire scheme.

In some embodiments, the controller 2002 and the plurality of semiconductor chips 2200 may be included in one package. In some embodiments, the controller 2002 and the plurality of semiconductor chips 2200 may be mounted on a separate interposer substrate other than the main substrate 2001, and the controller 2002 and the plurality of semiconductor chips 2200 may be connected to each other through wirings formed on the interposer substrate.

Figure 16:
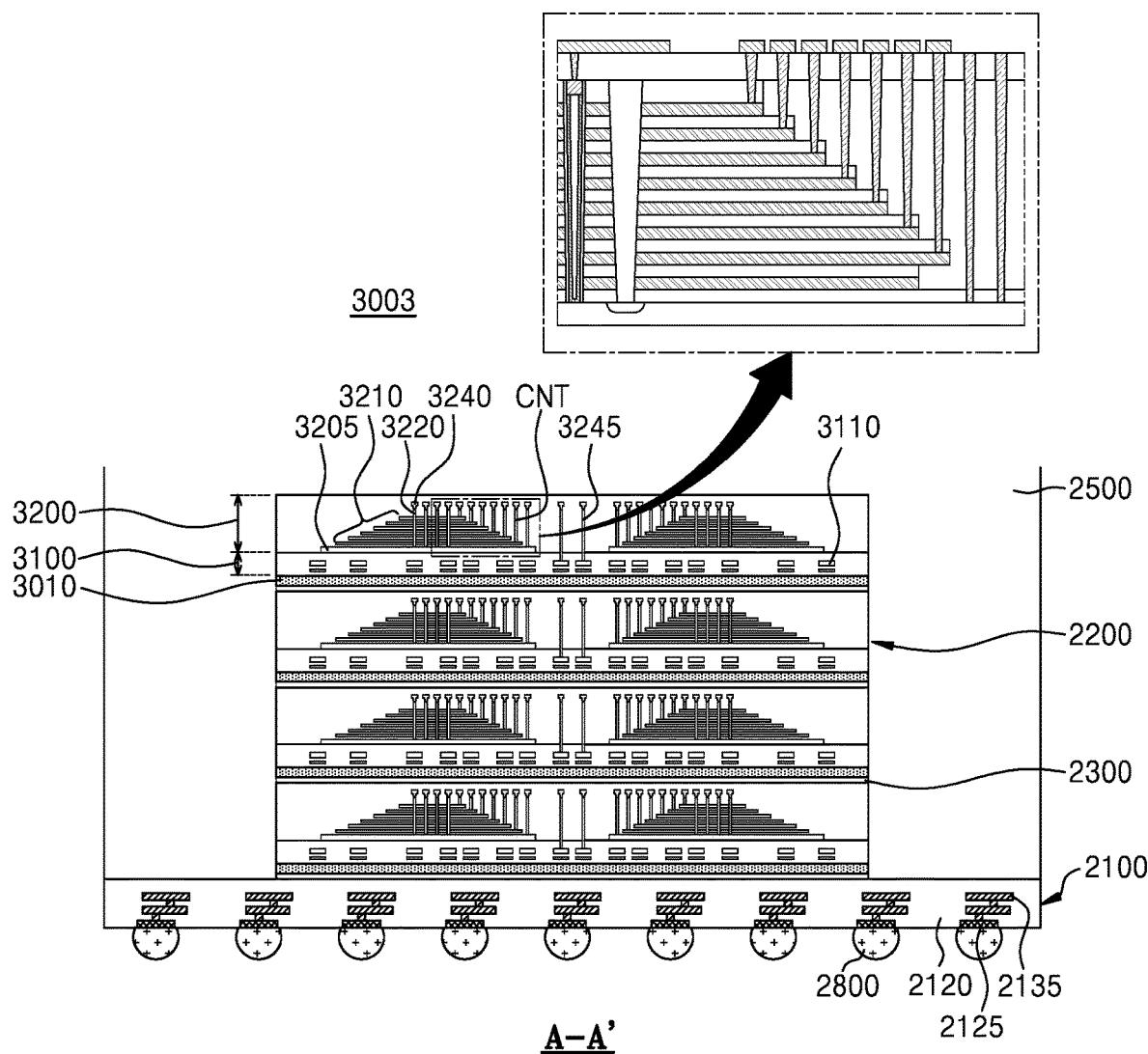
FIGS. 16 and 17 are cross-sectional views of semiconductor packages each including an integrated circuit device, according to an embodiment of the inventive concept.
Figure 17:
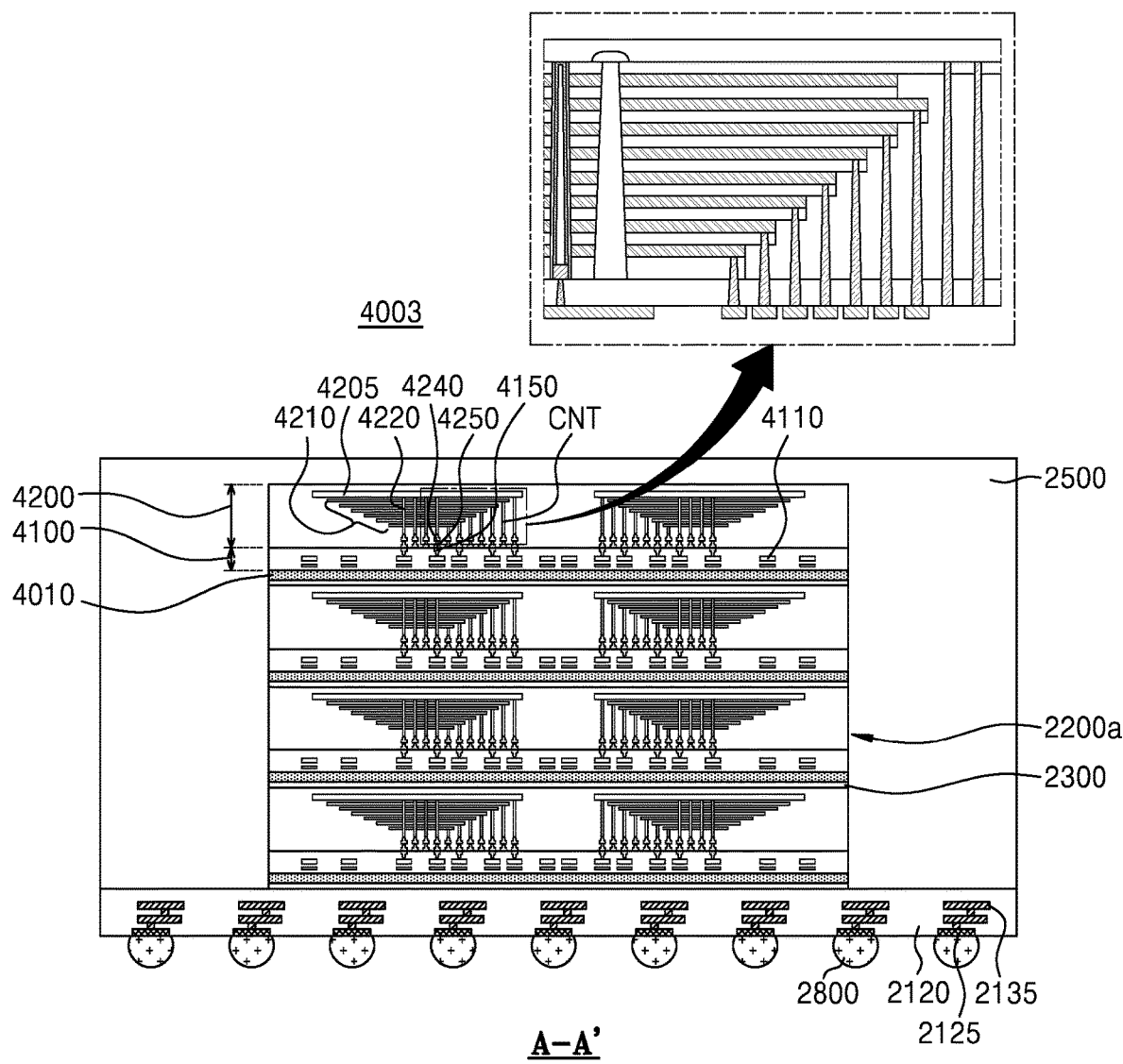

FIGS. 16 and 17 are cross-sectional views of semiconductor packages 3003 and 4003 each including an integrated circuit device, according to an embodiment of the inventive concept.

Particularly, FIGS. 16 and 17 are cross-sectional views taken along line A-A' of FIG. 15

Referring to FIG. 16, in the semiconductor package 3003, the package substrate 2100 may be a printed circuit board. The package substrate 2100 may include a body part 2120, the plurality of package upper pads 2130 (see FIG. 15) on an upper surface of the body part 2120, a plurality of lower pads 2125 arranged on or exposed through a lower surface of the body part 2120, and a plurality of internal wirings 2135 inside the body part 2120 to electrically connect the plurality of package upper pads 2130 to the plurality of lower pads 2125. The plurality of package upper pads 2130 may be electrically connected to the plurality of connection structures 2400 (see FIG. 15). The plurality of lower pads 2125 may be connected, through a plurality of conductive connection parts 2800, to the plurality of wiring patterns 2005 on the main substrate 2001 of the electronic system 2000 shown in FIG. 15.

Each of the plurality of semiconductor chips 2200 may include a semiconductor substrate 3010 and a first structure 3100 and a second structure 3200 sequentially stacked on the semiconductor substrate 3010. The first structure 3100 may include a peripheral circuit region including a plurality of peripheral wirings 3110. The first structure 3100 may include the peripheral circuit transistor 60TR as described with reference to FIG. 10. Although FIG. 16 shows that the first structure 3100 has a structure such as the peripheral circuit region of the integrated circuit device 200 shown in FIG. 10, the inventive concept is not limited thereto.

The second structure 3200 may include a common source line 3205, a gate stack 3210 on the common source line 3205, a channel structure 3220 passing through the gate stack 3210, and a bit line 3240 electrically connected to the channel structure 3220. The gate stack 3210 may include the first and second gate stacks GS1 and GS2 shown in FIG. 11. The first and second gate stacks GS1 and GS2 may include the plurality of first gate electrodes 130 and the plurality of second gate electrodes 230, respectively. In addition, each of the plurality of semiconductor chips 2200 may include the plurality of second contact plugs CNT2 electrically connected to the plurality of first gate electrodes 130 and the plurality of second gate electrodes 230.

Each of the plurality of semiconductor chips 2200 may include through wirings 3245 electrically connected to the plurality of peripheral wirings 3110 of the first structure 3100 and extending to the inside of the second structure 3200. The through wirings 3245 may be outside the gate stack 3210. In other embodiments, the semiconductor package 3003 may further include a through wiring passing through the gate stack 3210. Each of the plurality of semiconductor chips 2200 may further include the input-output pads 2201 (see FIG. 15) electrically connected to the plurality of peripheral wirings 3110 of the first structure 3100.

Referring to FIG. 17, the semiconductor package 4003 may have a similar structure to that of the semiconductor package 3003 described with reference to FIG. 16. However, the semiconductor package 4003 includes a plurality of semiconductor chips 2200a.

Each of the plurality of semiconductor chips 2200a may include a semiconductor substrate 4010, a first structure 4100 on the semiconductor substrate 4010, and a second structure 4200 on the first structure 4100 and bonded to the first structure 4100 by a wafer bonding scheme.

The first structure 4100 may include a peripheral circuit region including peripheral wirings 4110 and a plurality of first bonding structures 4150. The first structure 4100 may include the peripheral circuit transistor 60TR as described with reference to FIG. 10. Although FIG. 17 shows that the first structure 4100 has a structure such as the peripheral circuit region of the integrated circuit device 200 shown in FIG. 10, the inventive concept is not limited thereto.

The second structure 4200 may include a common source line 4205, a gate stack 4210 between the common source line 4205 and the first structure 4100, and a channel structure 4220 passing through the gate stack 4210. The gate stack 4210 may include the first and second gate stacks GS1 and GS2 shown in FIG. 11. The first and second gate stacks GS1 and GS2 may include the plurality of first gate electrodes 130 and the plurality of second gate electrodes 230, respectively. In addition, each of the plurality of semiconductor chips 2200a may include the plurality of second contact plugs CNT2 electrically connected to the plurality of first gate electrodes 130 and the plurality of second gate electrodes 230.

In addition, each of the plurality of semiconductor chips 2200a may include a plurality of second bonding structures 4250 electrically connected to the plurality of first gate electrodes 130 and the plurality of second gate electrodes 230 of the gate stack 4210. For example, some of the plurality of second bonding structures 4250 may be connected to a bit line 4240 electrically connected to the channel structure 4220. Others of the plurality of second bonding structures 4250 may be electrically connected to the plurality of first gate electrodes 130 and the plurality of second gate electrodes 230 of the gate stack 4210 through the plurality of second contact plugs CNT2.

The plurality of first bonding structure 4150 of the first structure 4100 and the plurality of second bonding structure 4250 of the second structure 4200 may be in contact with each other and bonded to each other. Bonding parts of the plurality of first bonding structure 4150 and the plurality of second bonding structure 4250 may include a metal, e.g., copper (Cu) but are not limited thereto.

While the inventive concept has been particularly shown and described with reference to embodiments thereof, it will be understood that various changes in form and details may be made therein without departing from the scope of the following claims.

What is claimed is:

1. An integrated circuit device comprising:
    a semiconductor substrate including a cell region and a connection region adjacent to the cell region;
    a gate stack comprising a plurality of gate electrodes and a plurality of insulating layers extending on a main surface of the semiconductor substrate in a horizontal direction and alternately stacked thereon in a vertical direction, the gate stack having a stair structure in the connection region;
    a channel structure in the cell region and extending through the plurality of gate electrodes in the vertical direction; and
    a plurality of contact plugs in the connection region,
    wherein, in a portion of the connection region, a first length, in the horizontal direction, of a first gate electrode that is located in a lowest layer among the plurality of gate electrodes is less than a second length, in the horizontal direction, of a second gate electrode that is located above the first gate electrode, and
    wherein, in the portion of the connection region, the first length of the first gate electrode is greater than a third length, in the horizontal direction, of at least one of the plurality of gate electrodes.

2. The integrated circuit device of claim 1, wherein a first contact plug adjacent to the first gate electrode among the plurality of contact plugs is in direct contact with the semiconductor substrate without being in direct contact with the first gate electrode, and
    wherein the first contact plug is separated from the plurality of gate electrodes.

3. The integrated circuit device of claim 2, wherein the first contact plug is a dummy contact plug.

4. The integrated circuit device of claim 1,
    wherein the gate stack comprises a first gate stack of a plurality of gate stacks that have respective stair structures in the connection region,
    wherein, in another portion of the connection region, a first length, in the horizontal direction, of a lowermost gate electrode of a second gate stack of the plurality of gate stacks is greater than a second length, in the horizontal direction, of another gate electrode of the second gate stack.

5. The integrated circuit device of claim 4, wherein a first contact plug among the plurality of contact plugs is in direct contact with the lowermost gate electrode.

6. The integrated circuit device of claim 5, wherein the first contact plug is a ground contact plug.

7. The integrated circuit device of claim 4, wherein the first length of the lowermost gate electrode is greater than the first length of the first gate electrode.

8. The integrated circuit device of claim 7, wherein, in a top view, the lowermost gate electrode protrudes in the horizontal direction beyond the first gate electrode.

9. The integrated circuit device of claim 1, wherein each of the plurality of contact plugs has a shape that is tapered toward the main surface of the semiconductor substrate.

10. The integrated circuit device of claim 1, further comprising a peripheral circuit structure between the semiconductor substrate and the gate stack.

11. An integrated circuit device comprising:
    a semiconductor substrate including a cell region and a connection region adjacent to the cell region and including a first part and a second part neighboring each other;
    a first gate stack comprising a plurality of gate electrodes and a plurality of insulating layers extending on a main surface of the semiconductor substrate in a horizontal direction and alternately stacked thereon in a vertical direction, the first gate stack having a stair structure in the connection region;
    a channel structure in the cell region and extending through the plurality of gate electrodes in the vertical direction;
    a plurality of contact plugs in the connection region; and
    a second gate stack having a stair structure in the connection region,
    wherein, in the first part of the connection region, a first length, in the horizontal direction, of a first gate electrode of the first gate stack that is located in a lowest layer among the plurality of gate electrodes is less than a second length, in the horizontal direction, of a second gate electrode of the first gate stack that is located above the first gate electrode, and a first contact plug of the plurality of contact plugs that is adjacent to the first gate electrode is in direct contact with the semiconductor substrate without being in direct contact with any of the plurality of gate electrodes, and
    wherein, in the second part of the connection region, a first length of a lowermost, first gate electrode of the second gate stack is greater than a second length of a second gate electrode of the second gate stack that is located above the first gate electrode of the second gate stack, and a second contact plug of the plurality of contact plugs is in direct contact with the first gate electrode of the second gate stack.

12. The integrated circuit device of claim 11, wherein the horizontal direction is a first horizontal direction,
    wherein each of the first gate electrodes is a ground select line,
    wherein, in a top view, the first gate electrode of the second gate stack protrudes in the first horizontal direction beyond the first gate electrode of the first gate stack, and wherein, in the top view, the first gate electrode of the second gate stack is separated from the first gate electrode of the first gate stack in a second horizontal direction intersecting the first horizontal direction.

13. The integrated circuit device of claim 12,
wherein the first contact plug located in the first part of the connection region is a dummy contact plug,
wherein the second contact plug located in the second part of the connection region is a ground contact plug, and
wherein the first contact plug and the second contact plug each have a shape that is tapered toward the main surface of the semiconductor substrate.

14. The integrated circuit device of claim 13, further comprising a plurality of conductive lines,
wherein no conductive line is electrically connected to an upper surface of the dummy contact plug, and
wherein a first conductive line of the plurality of conductive lines is electrically connected to an upper surface of the ground contact plug.

15. The integrated circuit device of claim 13, wherein a first height of the dummy contact plug in the vertical direction is greater than a second height of the ground contact plug in the vertical direction.

16. The integrated circuit device of claim 11,
wherein, in the first part of the connection region, a side wall of an end portion of each of the first and second gate electrodes of the first gate stack faces a side wall of the first contact plug, and
wherein in the second part of the connection region, a side wall of an end portion of the second gate electrode of the second gate stack faces a side wall of the second contact plug, and a side wall of an end portion of the first gate electrode of the second gate stack does not face the side wall of the second contact plug.

17. The integrated circuit device of claim 11, further comprising a third gate stack that is stacked on the first gate stack.

18. The integrated circuit device of claim 17, wherein the channel structure extends in a first channel hole passing through the first gate stack and in a second channel hole passing through the third gate stack.

19. An electronic system comprising:
a main substrate;
an integrated circuit device on the main substrate; and
a controller on the main substrate and electrically connected to the integrated circuit device,
wherein the integrated circuit device comprises:
a semiconductor substrate including a cell region and a connection region adjacent to the cell region;
a gate stack comprising a plurality of gate electrodes and a plurality of insulating layers extending on a main surface of the semiconductor substrate in a horizontal direction and alternately stacked thereon in a vertical direction, the gate stack having a stair structure in the connection region;
a channel structure in the cell region and extending through the plurality of gate electrodes in the vertical direction; and
a plurality of contact plugs in the connection region,
wherein, in a portion of the connection region, a first length, in the horizontal direction, of a first gate electrode that is located in a lowest layer among the plurality of gate electrodes is less than a second length, in the horizontal direction, of a second gate electrode that is located above the first gate electrode,
wherein, among the plurality of gate electrodes, the second gate electrode is between the first gate electrode and a third gate electrode in the vertical direction, and
wherein, in the portion of the connection region, the second length of the second gate electrode is greater than a third length, in the horizontal direction, of the third gate electrode.

20. The electronic system of claim 19,
wherein the main substrate further comprises wiring patterns electrically connecting the integrated circuit device to the controller, and
wherein a first contact plug among the plurality of contact plugs is a dummy contact plug and is in direct contact with the semiconductor substrate without being in direct contact with the first gate electrode, and
wherein, among the plurality of gate electrodes, the second gate electrode is directly between the first gate electrode and the third gate electrode.

* * * * *